(12) United States Patent
Sampath et al.

(10) Patent No.: US 9,893,227 B2
(45) Date of Patent: Feb. 13, 2018

(54) ENHANCED DEEP ULTRAVIOLET PHOTODETECTOR AND METHOD THEREOF

(71) Applicant: U.S. Army Research Laboratory ATTN: RDRL-LOC-I, Adelphi, MD (US)

(72) Inventors: Anand Venktesh Sampath, Montgomery Village, MD (US); Michael Wraback, Germantown, MD (US); Paul Shen, North Potomac, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 15/181,074

(22) Filed: Jun. 13, 2016

(65) Prior Publication Data

US 2016/0284919 A1    Sep. 29, 2016

Related U.S. Application Data

(63) Continuation-in-part of application No. 14/285,964, filed on May 23, 2014, now Pat. No. 9,379,271.
(Continued)

(51) Int. Cl.
*H01L 31/107* (2006.01)
*H01L 31/028* (2006.01)
(Continued)

(52) U.S. Cl.
CPC ...... *H01L 31/1075* (2013.01); *H01L 31/0336* (2013.01); *H01L 31/03044* (2013.01); *H01L 31/03046* (2013.01); *Y02E 10/544* (2013.01)

(58) Field of Classification Search
CPC ................. H01L 31/107; H01L 25/167; H01L 27/14643; H01L 31/02024;
(Continued)

(56) References Cited

U.S. PATENT DOCUMENTS 4,731,641 A * 3/1988 Matsushima ........... H01L 31/18
257/189
4,935,795 A    6/1990 Mikawa
(Continued)

FOREIGN PATENT DOCUMENTS

EP    0150564 A3    5/1986
EP    0082787 A1    6/1987
(Continued)

OTHER PUBLICATIONS

Konstantinov, A. O. et al., "Ionization rates and critical fields in 4H silicon carbide", Jul. 7, 1997, Applied Physics Letters 71, No. 1, pp. 90-92.*
(Continued)

*Primary Examiner* — Olik Chaudhuri
*Assistant Examiner* — Pauline Vu
(74) *Attorney, Agent, or Firm* — Lawrence E. Anderson

(57) ABSTRACT

A photodiode for detecting photons comprising a substrate; first semiconducting region suitable for forming a contact thereon; a first contact; a second semiconducting region comprising an absorption region for the photons and being formed of a semiconductor having one or more of a high surface recombination velocity or a high interface recombination velocity; a second contact operatively associated with the second region; the first semiconducting region and the second semiconducting region forming a first interface; the second semiconducting region being configured such that reverse biasing the photodiode between the first and second contacts results in the absorption region having a portion
(Continued)

depleted of electrical carriers and an undepleted portion at the reverse bias point of operation; the undepleted portion being smaller than the absorption depth for photons; whereby the depletion results in the creation of an electric field and photogenerated carriers are collected by drift; and a method of making.

20 Claims, 18 Drawing Sheets

Related U.S. Application Data

(60) Provisional application No. 62/174,710, filed on Jun. 12, 2015, provisional application No. 61/827,079, filed on May 24, 2013.

(51) Int. Cl.
*H01L 31/0304* (2006.01)
*H01L 31/0336* (2006.01)

(58) Field of Classification Search
CPC .......... H01L 31/02027; H01L 31/1075; H01L 31/0304; H01L 31/03044; H01L 31/03048; H01L 31/0376; H01L 31/03765; H01L 29/66113; H01L 31/03046; H01L 31/105; H01L 31/03687; H01L 31/1804; H01L 31/1812
See application file for complete search history.

(56) References Cited

U.S. PATENT DOCUMENTS

| | | | | |
|---|---|---|---|---|
| 4,984,032 A * | 1/1991 | Miura | ............... | H01L 31/03042 257/186 |
| 5,212,395 A * | 5/1993 | Berger | ............... | H01L 31/02161 136/256 |
| 5,311,047 A * | 5/1994 | Chang | ................. | H01L 31/1105 257/187 |
| 5,394,005 A * | 2/1995 | Brown | ............... | H01L 31/03528 257/461 |
| 5,569,942 A * | 10/1996 | Kusakabe | ........... | H01L 31/1075 257/186 |
| 6,137,123 A * | 10/2000 | Yang | ................. | H01L 31/03046 257/184 |
| 6,326,654 B1 | 12/2001 | Ruden | | |
| 6,838,741 B2 | 1/2005 | Sandvik | | |
| 7,049,640 B2 | 5/2006 | Boisvert | | |
| 7,902,545 B2 * | 3/2011 | Csutak | .................... | B82Y 20/00 257/14 |
| 8,269,222 B2 | 9/2012 | Shen et al. | | |
| 8,269,223 B2 | 9/2012 | Wraback | | |
| 2003/0226952 A1* | 12/2003 | Clark | ............... | H01L 31/02027 250/214.1 |
| 2004/0108530 A1* | 6/2004 | Sandvik | ............ | H01L 31/02322 257/290 |
| 2004/0251483 A1* | 12/2004 | Ko | ...................... | H01L 31/1075 257/292 |
| 2005/0006678 A1* | 1/2005 | Tanaka | ................. | H01L 31/1075 257/292 |
| 2005/0098884 A1 | 5/2005 | Cheng | | |
| 2005/0167709 A1* | 8/2005 | Augusto | ........... | H01L 27/14643 257/292 |
| 2005/0218414 A1* | 10/2005 | Ueda | ................. | H01L 21/02082 257/94 |
| 2006/0001118 A1* | 1/2006 | Boisvert | ............ | H01L 31/1075 257/438 |
| 2006/0017129 A1* | 1/2006 | Nakaji | ............... | H01L 31/03046 257/438 |
| 2006/0186501 A1* | 8/2006 | Ishimura | ............... | H01L 31/107 257/436 |
| 2006/0202297 A1* | 9/2006 | Ishimura | .......... | H01L 31/02161 257/436 |
| 2006/0263923 A1* | 11/2006 | Alfano | .................. | B82Y 10/00 438/48 |
| 2006/0273421 A1* | 12/2006 | Yasuoka | ............. | H01L 31/0232 257/438 |
| 2007/0093073 A1* | 4/2007 | Farrell, Jr. | ............. | B82Y 20/00 438/763 |
| 2007/0194300 A1* | 8/2007 | Ibbetson | ................. | H01L 29/88 257/30 |
| 2007/0267653 A1* | 11/2007 | Yoneda | ............... | H01L 31/0304 257/186 |
| 2008/0191240 A1* | 8/2008 | Yagyu | ................. | H01L 31/1075 257/186 |
| 2008/0230862 A1* | 9/2008 | Singh | .................. | H01L 27/1446 257/436 |
| 2008/0283822 A1* | 11/2008 | Yui | ........................ | H01L 33/06 257/13 |
| 2009/0065900 A1* | 3/2009 | Saito | ........................ | H01L 33/16 257/615 |
| 2009/0315073 A1* | 12/2009 | Shi | .................... | H01L 31/02027 257/185 |
| 2009/0325339 A1* | 12/2009 | Niiyama | ............... | B82Y 20/00 438/72 |
| 2010/0006780 A1* | 1/2010 | Metcalfe | ................ | G02F 2/004 250/504 R |
| 2010/0187550 A1* | 7/2010 | Reed | ....................... | H01L 33/18 257/98 |
| 2010/0220761 A1* | 9/2010 | Enya | ...................... | H01S 5/3202 372/45.01 |
| 2011/0001392 A1* | 1/2011 | Masmanidis | ......... | B81B 3/0021 310/316.03 |
| 2011/0024768 A1* | 2/2011 | Veliadis | ............ | H01L 27/14609 257/77 |
| 2011/0291108 A1* | 12/2011 | Shen | ................ | H01L 31/03687 257/77 |
| 2011/0291109 A1* | 12/2011 | Wraback | ............. | H01L 31/1075 257/77 |
| 2012/0016538 A1* | 1/2012 | Waite | ..................... | G01C 21/20 701/3 |
| 2013/0016203 A1* | 1/2013 | Saylor | ................... | G06K 9/00604 348/78 |
| 2013/0032860 A1* | 2/2013 | Marino | ............. | H01L 29/66462 257/194 |
| 2014/0084146 A1 | 3/2014 | Boisvert | | |
| 2015/0311375 A1 | 10/2015 | Shen et al. | | |

FOREIGN PATENT DOCUMENTS

| | | | | |
|---|---|---|---|---|
| EP | 1833095 A1 * | 9/2007 | ....... | H01L 31/03529 |
| EP | 2175497 A2 | 4/2010 | | |
| WO | WO 2013058715 A1 * | 4/2013 | .......... | H01L 31/107 |

OTHER PUBLICATIONS

Xiangyi Guo et al., "Demonstration of ultraviolet separate absorption and multiplication 4H-SiC avalanche photodiodes", Jan. 1, 2006, in IEEE Photonics Technology Letters, vol. 18, No. 1, pp. 136-138.*

X. Guo et al., "Performance of Low-Dark-Current 4H-SiC Avalanche Photodiodes With Thin Multiplication Layer", Sep. 2006, in IEEE Transactions on Electron Devices, vol. 53, No. 9, pp. 2259-2265.*

Sandvik, P. et al., "SiC deep ultraviolet avalanche photodetectors", Oct. 2010, General Electric Global Research Niksayuna NY.*

Lin Qi, K., et al.,"UV-Sensitive Low Dark-Count PureB Single-Photon Avalanche Diode," IEEE Transactions on Electron Devices, vol. 61, No. 11, 3768-3774, Nov. 2014.

Ariane L. Beck, et al. "Quasi-Direct UV/Blue GaP Avalanche Photodetectors," IEEE Journal of Quantum Electronics, vol. 40, No. 12, 1695-1699, Dec. 2004.

Poster presented at the IEEE Lester Eastman Conference on High Performance Devices on Aug. 7, 2013 entitled "Aluminum Gallium Nitride/Silicon Carbide Separate Absorption and Multiplication Avalanche Photodiodes."

(56) References Cited

OTHER PUBLICATIONS

Shao, Zhen, et al., "High-Gain AlGaN Solar-Blind Avalanche Photodiodes," IEEE Electron Device Letters, vol. 35, No. 3, pp. 372-374, Mar. 2014.

Sun, L. et al., "AlGaN Solar-blind Avalanche Photodiodes with High Multiplication Gain", Applied Physics Letters-97 (191103) Nov. 2010 DOI: 10.1063/1.3515903.

Suvarna, P., "Design and Growth of Visible-Blind and Solar-Blind II-N APDs on Sapphire Substrates," J. Electron. Mater. 42, 854-858 (2013).

X. Bai, et al. "High Detection Sensitivity of Ultraviolet 4H-SiC Avalanche Photodiodes", IEEE J. Quantum Electron 43, 1159 (2007).

L.E. Rodak, A.V. Sampath, C.S. Gallinat, Y. Chen, Q. Zhou, J.C. Campbell, H. Shen, and M. Wraback. "Solar-blind AlxGa1-xN/AlN/SiC photodiodes with a polarization-induced electron filter." Applied Physics Letters 103 No. 7 (2013): 071110.

Y. Zhang, et al., "GaN ultraviolet avalanche photodiodes fabricated on free-standing bulk GaN substrates," Phys. stat. sol. (c) 5, No. 6, 2290-2292 (2008).

Anand V. Sampath, et al., "P-type Interface Charge Control Layers for Enabling GaN/SiC Separate Absorption and Multiplication Avalanche Photodiodes", Applied Physics Letters, 101, (2012) 093506.

A.V. Sampath, L.E. Rodak. Y. Chen, Q. Zhou. J.C. Campbell, H. Shen and M. Wraback, "Enhancing the Deep Ultraviolet Performance of 4H-SiC Based Photodiodes" ECS Transactions, 61 (4) 227-234 (2014).

S. Soloviev, A. Vert, J. Fronheiser, P. Sandvik, "Positive Temperature Coefficient of Avalanche Breakdown Observed in a-Plane 6H-SiC Photodiodes," Materials Science Forum vols. 615-617 (2009) pp. 873-876.

Handin Liu, et al. " 4H-SiC PIN Recessed-Window Avalanche Photodiode With High Quantum Efficiency" IEEE Photonics Technology Letters 20, No. 18, (2008) 1551.

E. Munoz, "III nitrides and UV detection," J. Phys.: Condens. Matter, 13, 7115-7137 (2001).

Sun, L. et al. "AlGaN solar-blind avalanche photodiodes with high multiplication gain," J. Electron. Mater. 42, 854 (2013).

McClintock, R., et al. "Avalanche multiplication in AlGaN based solar-blind photodetectors," Appl. Phys. Lett., 87, (241123) (2005).

Tut, T. et al. "AlxGa1-xN-based avalanche photodiodes with high reproducible avalanche gain," Appl. Phys. Lett., 90, (163506) (2007).

Yoo, Dongwon, et al. "Al x Ga 1-x N Ultraviolet Avalanche Photodiodes Grown on GaN Substrates." Photonics Technology Letters, IEEE 19, No. 17 (2007): 1313-1315.

X. Bai, "High Detection Sensitivity of Ultraviolet 4H-SiC Avalanche Photodiodes," IEEE J. Quantum Electron 43, 1159 (2007).

H. Liu, "4H-SiC PIN Recessed-Window Avalanche Photodiode With High Quantum Efficiency," IEEE Photonic Technol. Lett. 20, 1551 (2008).

A. Sciuto, "High responsivity 4 H—Si C Schottky UV photodiodes based on the pinch-off surface effect," Appl. Phys. Lett. 89, 081111 (2006).

X. Xin, "Demonstration of 4H-SiC visible-blind EUV and UV detector with large detection area" Electron. Lett., 41 (2005).

A.V. Sampath, et al. "High quantum efficiency deep ultraviolet 4H-SiC photodetectors," Electronics Letters, vol. 49, Issue 25, Dec. 5, 2013, p. 1629-1630.

Electronic archiv: "New Semiconductor Materials. Characteristics and Properties," NSM Archive—Silicon Carbide (SiC) Band structure, w. © 1999-2014.

Ahrenkiel, R.K., et al., "An optical technique for measuring surface recombination velocity" Solar Energy Materials & Solar Cells 93(2009)645-649.

* cited by examiner

Calculated Q.E. of a n-i-p SiC diode with increasing depletion of the top illuminated n-layer. Nanometers abbreviated as nm.

FIG. 5 Calculated gain in a SiC p-i-n diode as a function of photon wavelength at constant reverse bias for illumination of the n-side down and p-side down.

Electric Field distribution in DUV-APD

ENHANCED DEEP ULTRAVIOLET PHOTODETECTOR AND METHOD THEREOF

CROSS-REFERENCE TO RELATED APPLICATIONS

This application claims priority of U.S. Provisional Application 62/174,710 filed Jun. 12, 2015, entitled "Enhanced Deep Ultraviolet Photodetector and Method Thereof" by Anand Sampath, Paul Shen and Michael Wraback filed Jun. 12, 2015, the contents of which are incorporated herein by reference. This application also claims priority to U.S. patent application Ser. No. 14/285,964, filed May 23, 2014, entitled "Variable Range Photodetector and Method Thereof" by Paul Shen, et al. (ARL 13-27), which was published as U.S. Pub. Appl. No. 2015/0311375 on Oct. 29, 2015, and which in turn claims priority to U.S. Provisional Patent Application Ser. No. 61/827,079 entitled "Photodetector With Polarization Induced Electron Filter And Method Thereof," filed May 24, 2013, both of which are incorporated herein by reference.

GOVERNMENT INTEREST

The embodiments herein may be manufactured, used, and/or licensed by or for the United States Government without the payment of royalties thereon.

BACKGROUND OF THE INVENTION

I. Field of the Invention

The present invention relates to photodetectors and methods for making such photodetectors.

II. Description of Related Art

In avalanche photodiodes (APDs) or photodetectors, incoming light is used to generate carriers (i.e., free electrons or holes) that are collected as current. Semiconductor materials are selected for photodiodes based upon the wavelength range of the radiation that is desired to be utilized or detected. APDs are operated at high reverse-bias voltages where avalanche multiplication takes place. The multiplication of carriers in the high electric field depletion region in these structures gives rise to internal current gain. In linear mode operation, the output photo-induced current within the APD is linearly proportional to the illuminating photon flux, with the level of gain increasing with reverse bias. Importantly, the dark current that flows through the APD also tends to increase with increasing reverse bias. When biased sufficiently above the breakdown voltage, commonly referred to as excess bias, the APD can have sufficient internal gain so that an incident photon can induce a large and self-sustaining avalanche. This operating scheme is often referred to as Geiger mode and the diode along with enabling circuitry may be referred to as a single photon-counting avalanche photodiode (SPAD). In this mode, a non-photogenerated carrier may also be excited leading to avalanche current that is referred to as a dark count. In practice, the detection efficiency and dark count rate for the SPAD increase with increasing excess bias.

High sensitivity deep ultraviolet (DUV) photodetectors operating at wavelengths shorter than 280 nm are useful for various applications, including chemical and biological identification, optical wireless communications, and UV sensing systems. Often, these applications require very low light level or single photon detection and, as a result, photomultiplier tubes (PMTs) are widely used. However, in addition to being large and fragile, PMTs require the use of expensive filters to limit the bandwidth of detection. While APDs can be more compact, lower cost and more rugged than the commonly used PMTs, commercially available devices such as silicon (Si) single photon counting APDs (SPADs) have poor DUV single photon detection efficiency.

Group III-nitride avalanche detectors can presumably be widely functional between 200 nm and 1900 nm (i.e. infrared to ultraviolet radiation). Aluminum gallium nitride ($Al_xGa_{1-x}N$) photodetectors can take advantage of a sharp and tunable direct band gap to achieve high external quantum efficiency and avalanche multiplication in $Al_xGa_{1-x}N$ based p-i-n diodes has been reported. See, e.g., L. Sun, J. Chen. J. Li, H. Jiang, "AlGaN Solar-blind Avalanche Photodiodes With High Multiplication Gain," *Appl. Phys. Lett.*, 97, (191103) (2010) and P. Suvarna, M. Tungare, J. M. Leathersich, P. Agnihotri, F. Shahedipour-Sandvik, L. D. Bell, and S. Nikzad, "Design and Growth of Visible-Blind and Solar-Blind III-N APDs on Sapphire Substrates," *J. Electron. Mater.* 42, 854 (2013)), both of which are herein incorporated by reference.

However, this approach is limited by the difficulty in doping high AlN mole fraction alloys p-type, and a very large breakdown electric field for high AlN mole fraction that implies higher voltage operation and greater susceptibility to dark current associated with defects in the material. Therefore, a need remains for low cost, compact, high sensitivity, low dark current/dark count rate photodetectors operating in the ultraviolet spectrum.

Silicon Carbide (SiC) photodetectors have emerged as an attractive candidate for DUV pin photodetectors and APDs due to their very low dark currents, small k factor, and high gain. State-of-the-art SiC APDs employing a recessed top window exhibit peak quantum efficiency (QE) of 60% at 268 nm and k factor of ~0.1, and dark current of 90 pA at a gain of 1000. See, X. Bai, X. Guo, D. C. Mcintosh, H. Liu, and J. C. Campbell, "High Detection Sensitivity of Ultraviolet 4H-SiC Avalanche Photodiodes", *IEEE J. Quantum Electron* 43, 1159 (2007), herein incorporated by reference. These dark currents are more than three orders of magnitude lower than what has been reported for $Al_xGa_{1-x}N$ based APDs. See, e.g., L. Sun, J. Chen, J. Li, H. Jiang, "AlGaN Solar-blind Avalanche Photodiodes With High Multiplication Gain," *Appl. Phys. Lett.*, 97, (191103) (2010), herein incorporated by reference. However, the responsivity of these devices diminishes at wavelengths shorter than 260 nm due to increasing absorption and carrier generation in the illuminated doped layer of this device and the short effective diffusion length of minority carriers in this region in the presence of a high density of surface states through which these photogenerated carriers recombine.

In general, the short wavelength response in pin detectors associated with detection of photons having energies much greater than the band gap of a semiconductor having a high density of surface states is hindered by the absorption of these photons near the surface of the heavily doped illuminated layer (p- or n-type). As a result, photo-generated carriers are trapped by surface band bending and are lost to surface recombination; the carrier transport in this layer may be characterized as diffusion, associated with the spatial gradient in photogenerated carriers, with a significantly reduced diffusion length for minority carriers over what would be expected in the bulk that can be described as a shorter effective diffusion length.

A number of groups have explored Schottky and metal-semiconductor-metal (MSM) 4H-SiC photodetectors to address this issue by enabling more efficient collection of carriers through photogeneration of these carriers primarily within the depletion region of the device. A. Sciuto, et al., "High responsivity 4H-SiC Schottky UV photodiodes based on the pinch-off surface effect," *Appl. Phys. Lett.* 89, 081111 (2006) (herein incorporated by reference), report a peak QE of 29% at 255 nm for vertical Schottky diodes fabricated on n-type 4H-SiC using the pinch-off surface effect to increase the direct optical absorption area in the detector. X. Xin, F. Yan, T. W. Koeth, C. Joseph, J. Hu, J. Wu, and J. H. Zhao: "Demonstration of 4H-SiC UV single photon counting avalanche photodiode," *Electron. Lett.*, 41 1192 (2005) (herein incorporated by reference) reported large-area, 2×2 mm, n-4H-SiC Schottky diodes with QE of ~20% at 200 nm. However, high efficiency single photon counting capable-APDs at wavelengths shorter than 260 nm have not been demonstrated to date. One challenge has been to realize a device design that mitigates the effects of surface recombination in these devices while maintaining sufficiently low dark currents at high bias to allow avalanche breakdown.

Therefore, a need remains for low cost, compact, high sensitivity, low dark current/dark count rate photodetectors that operate in the ultraviolet spectrum.

SUMMARY OF THE PRESENT INVENTION

The present invention is directed to, inter alia, an n-n$^-$-p photodetector wherein the thickness and doping of the illuminated n$^+$-SiC layer are such that it will be nearly depleted at high bias near or above avalanche breakdown, i.e., the thickness of the neutral and quasi-neutral regions in the n+ region will become larger than absorption length of the high energy photon of interest and/or the diffusion length of holes. The preferred thickness of the n$^+$ illuminated area or region is between 20-120 nm. Preferred doping range is between $9 \times 10^{17}$ to $5 \times 10^{18}$ cm$^{-3}$ with nitrogen atoms doping. Alternatively, an n-n'-n$^-$-p structure is employed to allow that the illuminated n'-region is nearly depleted at the operating bias of the photodetector, typically near or above avalanche breakdown. The n'-layer consists of an n-type doped layer where the dopant concentration varies with layer thickness such that n' is approximately equal to n at the n/n' interface and decreases or grades to that of the n$^-$ at the n'/n$^-$ interface. An illustration of this is shown in FIG. 11 where the n-type dopant, N, concentration is varied from approximately $2 \times 10^{18}$ cm$^{-3}$ to approximately $1 \times 10^{16}$ cm$^{-3}$ over a thickness of approximately 85 nm. Importantly, the free carrier concentration implied by the description of a layer as be n$^-$, i- or p$^-$ is essentially the same; that is it is sufficiently low such that the layer is depleted around zero bias.

Optional use of Al$_x$Ga$_{(1-x)}$N alloys as a transparent n-type window enables an increase in the collection of electron-hole pairs due to photogeneration of these carriers by high energy photons in the high-field n$^-$-SiC region. A peak QE of 76% at 242 nm has been measured on n-AlGaN/AlN/n$^-$-SiC/p-SiC n-i-p diodes that is attributed to the minimization of the effects of surface states and absorption in heavily doped layers currently hindering homogeneous SiC devices. See, L. E. Rodak, A. V. Sampath, C. S. Gallinat, Y. Chen, Q. Zhou, J. C. Campbell, H. Shen, and M. Wraback. "Solar-blind Al$_x$Ga$_{1-x}$N/AlN/SiC photodiodes with a polarization-induced electron filter." *Applied Physics Letters* 103 no. 7 (2013): 071110, herein incorporated by reference. Importantly, use of an n-Al$_x$Ga$_{(1-x)}$N n-type window may greatly reduce the thickness or remove the need for the illuminated n-SiC layer. In this case the structure would be n$^+$-AlGaN/i-SiC/p-SiC.

One preferred embodiment photodiode for detecting photons comprises:
a substrate;
a first semiconducting region operatively associated with the substrate suitable for forming a contact thereon;
a first contact operatively associated with the first semiconducting region;
a second semiconducting region comprising an absorption region for the photons having a predetermined energy range; the second region being formed of a semiconductor having one or more of a high surface recombination velocity or a high interface recombination velocity;
a second contact operatively associated with the second region;
the first semiconducting region and the second semiconducting region forming a first interface;
the second semiconducting region being configured such that reverse biasing the photodiode between the first and second contacts results in the absorption region having a portion depleted of electrical carriers and an undepleted portion at the reverse bias point of operation; the undepleted portion being smaller than the absorption depth for photons having a predetermined energy range;
whereby the depletion results in the creation of an electric field and photogenerated carriers are collected by drift.

As second preferred embodiment photodiode that eliminates or minimizes surface recombination of photogenerated carriers generated by photons having a predetermined energy range comprises
a substrate;
a first semiconducting region operatively associated with the substrate suitable for forming a contact thereon;
a first contact operatively associated with the first semiconducting region;
a second region comprising an absorption region for the photons having a predetermined energy range; the second region being formed of a semiconductor having a high surface or interface recombination velocity;
a second contact operatively associated with the second region;
the first semiconductor region and the second region forming a first interface; the second region being configured such that reverse biasing the photodiode between the first and second contacts results in depletion of the second region at the reverse bias point of operation from the first interface to at least one of the absorption depth and the sum of the absorption depth and effective diffusion length from the boundary of the second region;
whereby the depletion results in the creation of an electric field and photogenerated carriers are collected by drift.

The present invention is also directed to A method making a photodiode for detecting photons comprising:
\providing a substrate;
providing a first semiconducting region operatively associated with the substrate suitable for forming a contact thereon;
providing a first contact operatively associated with the first semiconducting region;
providing a second semiconducting region comprising an absorption region for the photons having a predetermined energy range; the second region being formed of a semiconductor having one or more of a high surface recombination velocity or a high interface recombination velocity;
providing a second contact operatively associated with the second region;
the first semiconducting region and the second semiconducting region forming a first interface;

the second semiconducting region being configured such that reverse biasing the photodiode between the first and second contacts results in the absorption region having a portion depleted of electrical carriers and an undepleted portion at the reverse bias point of operation; the undepleted portion being smaller than the absorption depth for photons having a predetermined energy range; whereby the depletion results in the creation of an electric field and photogenerated carriers are collected by drift.

These and other embodiments will be described in further detail below with respect to the following figures.

BRIEF DESCRIPTION OF THE DRAWING

A better understanding of the present invention will be had upon reference to the following detailed description, wherein like reference characters refer to like parts throughout the several views, and in which:

FIG. 3 illustrates the DC responsivity of SiC/AlN/AlxGa(1-x)N nip photodiode at zero, 5, 10, 15, 20, 22, 24, 25, 30, 35 and 40 volts reverse bias.

DETAILED DESCRIPTION OF PREFERRED EMBODIMENTS OF THE PRESENT INVENTION

Figure 1:
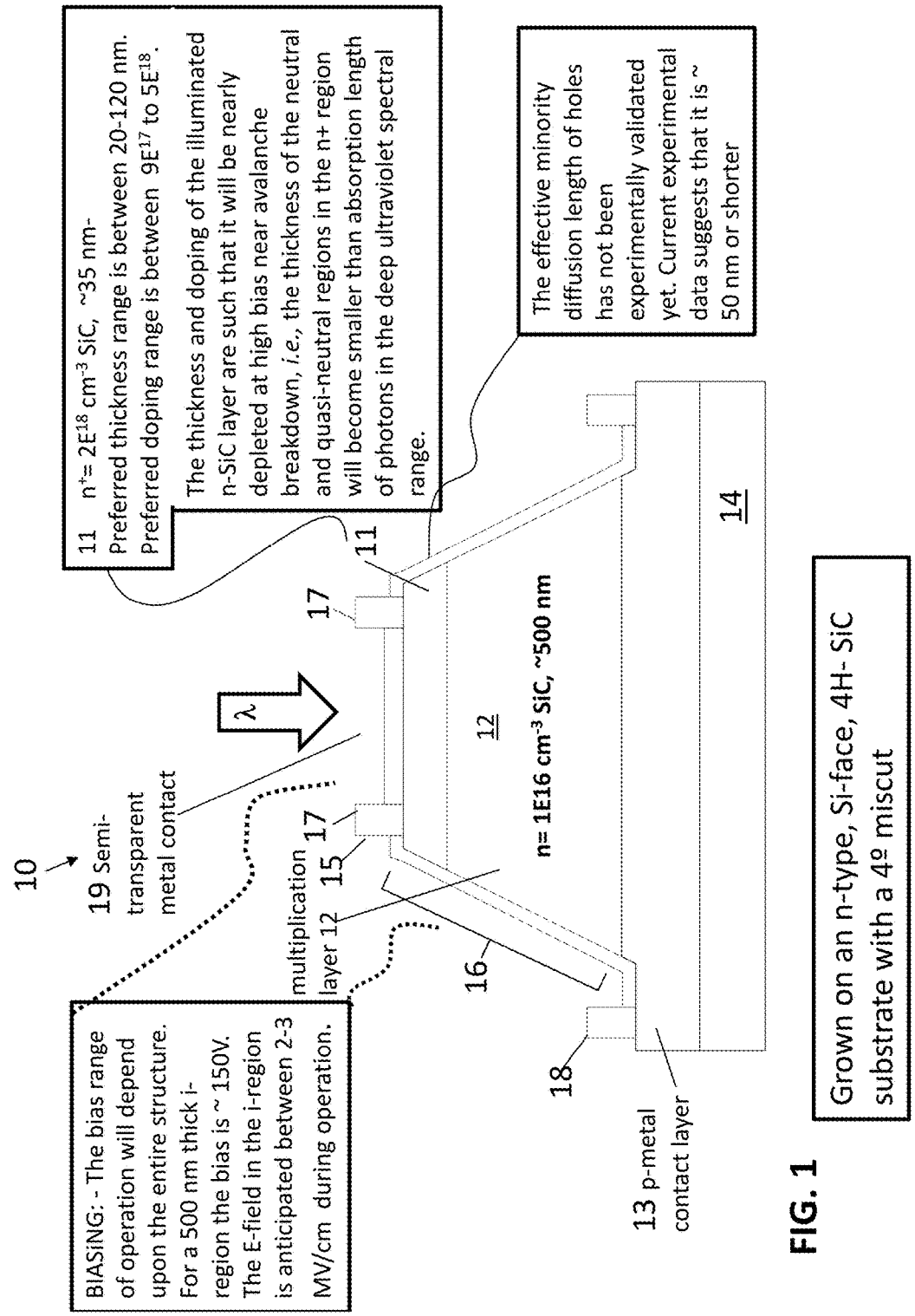
FIG. 1 is a schematic illustration of a preferred embodiment of the present invention consisting of an n-n$^-$p-SiC photodiode. At the reverse bias operating point, the illuminated n-layer is substantially depleted so that deep ultraviolet photon are substantially absorbed within the depletion region within this layer so that concomitant photogenerated carriers are collected more efficiently by drift.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention. Rather, these embodiments are provided so that this disclosure will be thorough and complete, and will fully convey the scope of the invention to those skilled in the art. In the drawings, the dimensions of objects and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various ranges, elements, components, regions, layers and/or sections, these elements, components, regions, layers and/or sections should not be limited by these terms. For example, when referring to first and second ranges, these terms are only used to distinguish one range from another range. Thus, a first element, component, region, layer or section discussed below could be termed a second element, component, region, layer or section without departing from the teachings of the present invention.

Furthermore, relative terms, such as "lower" or "bottom" and "upper" or "'top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention. Additionally, the drawings are not to scale. Relative sizes of components are for illustrative purposes only and do not reflect the actual sizes that may occur in any actual embodiment of the invention. Like numbers in two or more figures represent the same or similar elements. Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Embodiments of the present invention are described herein with reference to cross-section illustrations that are schematic illustrations of idealized embodiments of the present invention. As such, variations from the shapes of the elements in the illustrations are to be expected. Thus, embodiments of the present invention should not be construed as limited to the particular shapes of regions illustrated herein but are to include deviations in shapes. Thus, the layers or regions illustrated in the figures are schematic in nature and their shapes are not intended to illustrate the precise shape of a layer or region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 shows a preferred embodiment of an n-n$^-$-p SiC avalanche photodiode 10 that exhibits high responsivity at wavelengths shorter than 280 nm, gain and low dark current at high reverse bias, just short of avalanche breakdown. As a result, these devices are ideal for realizing a highly sensitive single-photon-counting avalanche photodiode (SPAD) in the deep ultraviolet spectrum ($\lambda$<260 nm) for the first time, based on SiC.

The SiC n-n$^-$-p structure or photodiode 10 includes an approximately 35 nm thick n+-layer 11 doped with $2\times10^{18}$ cm$^{-3}$ nitrogen atoms overlying a 480-500 nm thick n$^-$ layer, or i-layer, 12 doped with $1\times10^{16}$ cm$^{-3}$ nitrogen atoms which in turn overlies a 2000 nm thick p-layer 13 doped with an aluminum concentration of $2\times10^{18}$ cm$^{-3}$. The layer structure is grown on an n-type, Si-face, 4H-SiC substrate 14 with a 4° miscut. The avalanche photodiodes 10 have a 50-250 μm-diameter circular mesa 15 and seven degree beveled sidewalls 16.

A top n-type metal contact 17 includes a Ti 10 nm/Al 100 nm/Ni 30 nm/Au 50 nm metallization scheme while a p-SiC Ohmic contact 18 includes a layer of Ni 25 nm, Ti 35 nm, Al 100 nm, and Ni 80 nm. A thin semi-transparent metal contact 19 was deposited in a top window region to ensure lateral E-field spreading in the optical absorption area, and its transmission over the spectral range of interest should be about 50%.

Importantly, the thickness of the n-layer 12 may be varied to modify the gain and dark current within the diode for a given reverse bias. The thickness of the n-layer 12 may range from 250 nm to 960 nm, with the lower end of the range resulting in reduced reverse bias required for avalanche breakdown but likely reduced gain and increased dark current. In contrast, the higher end of the range will likely result in higher gain and lower dark current but with a higher reverse bias required for avalanche breakdown.

Figure 2:
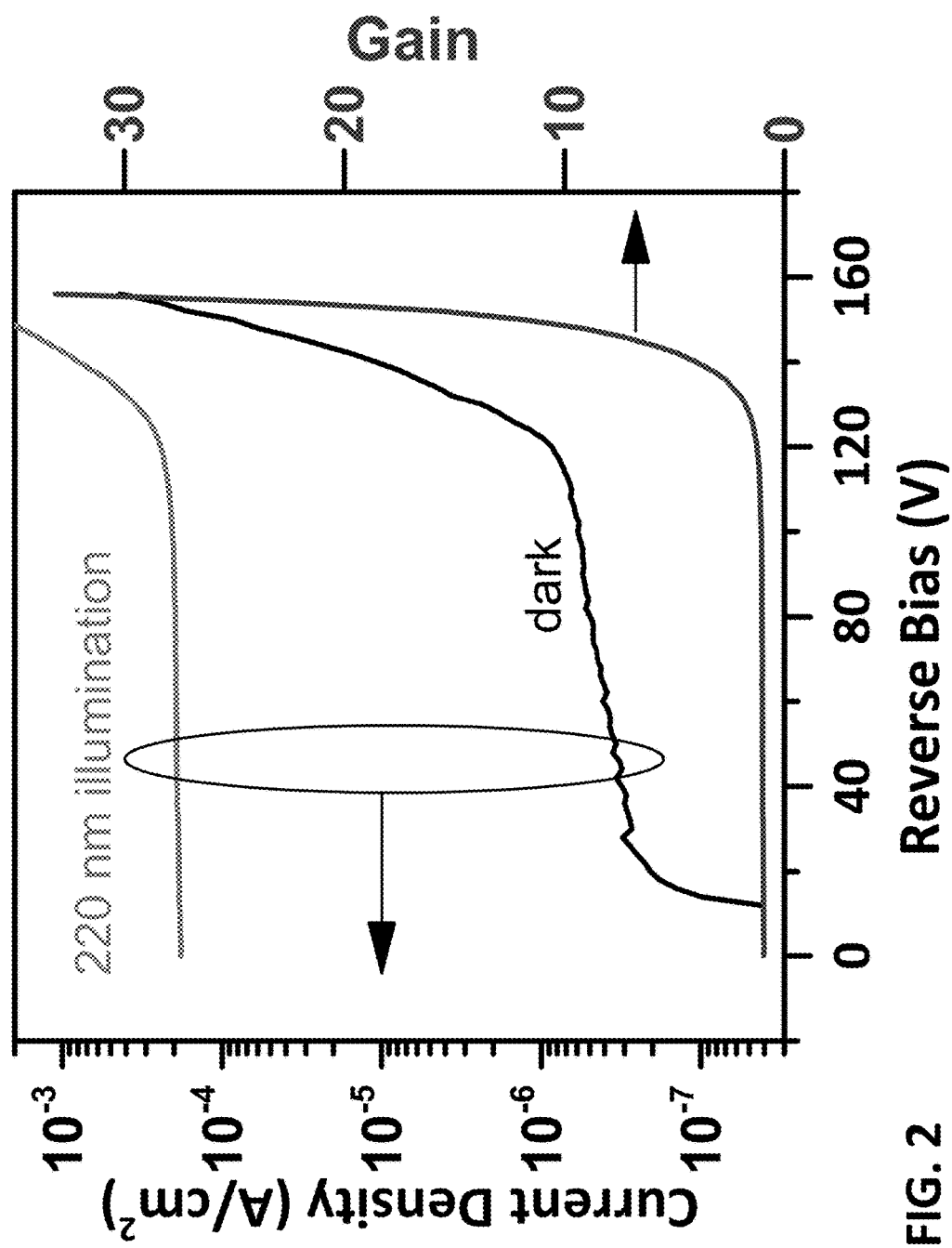
FIG. 2 illustrates the measured reversed bias voltage characteristics of the preferred embodiment of FIG. 1.

FIG. 2 shows the measured reversed bias IV characteristics of the fabricated deep ultraviolet avalanche photodiode (DUV-APD). The measured dark current increases slowly below 120V bias and then increases more rapidly to ~153V. It is important to note that the diameter of the tested devices were large, ~200 μm, in comparison to what has been investigated for GaN based APDs. See, for example, Y. Zhang, D. Yoo, J. Limb, J. Ryou, R. D. Dupuis, and S. Shen, "GaN ultraviolet avalanche photodiodes fabricated on freestanding bulk GaN substrates," *Phys. stat. sol.* (c) 5, No. 6, 2290-2292 (2008), herein incorporated by reference.

Figure 3:
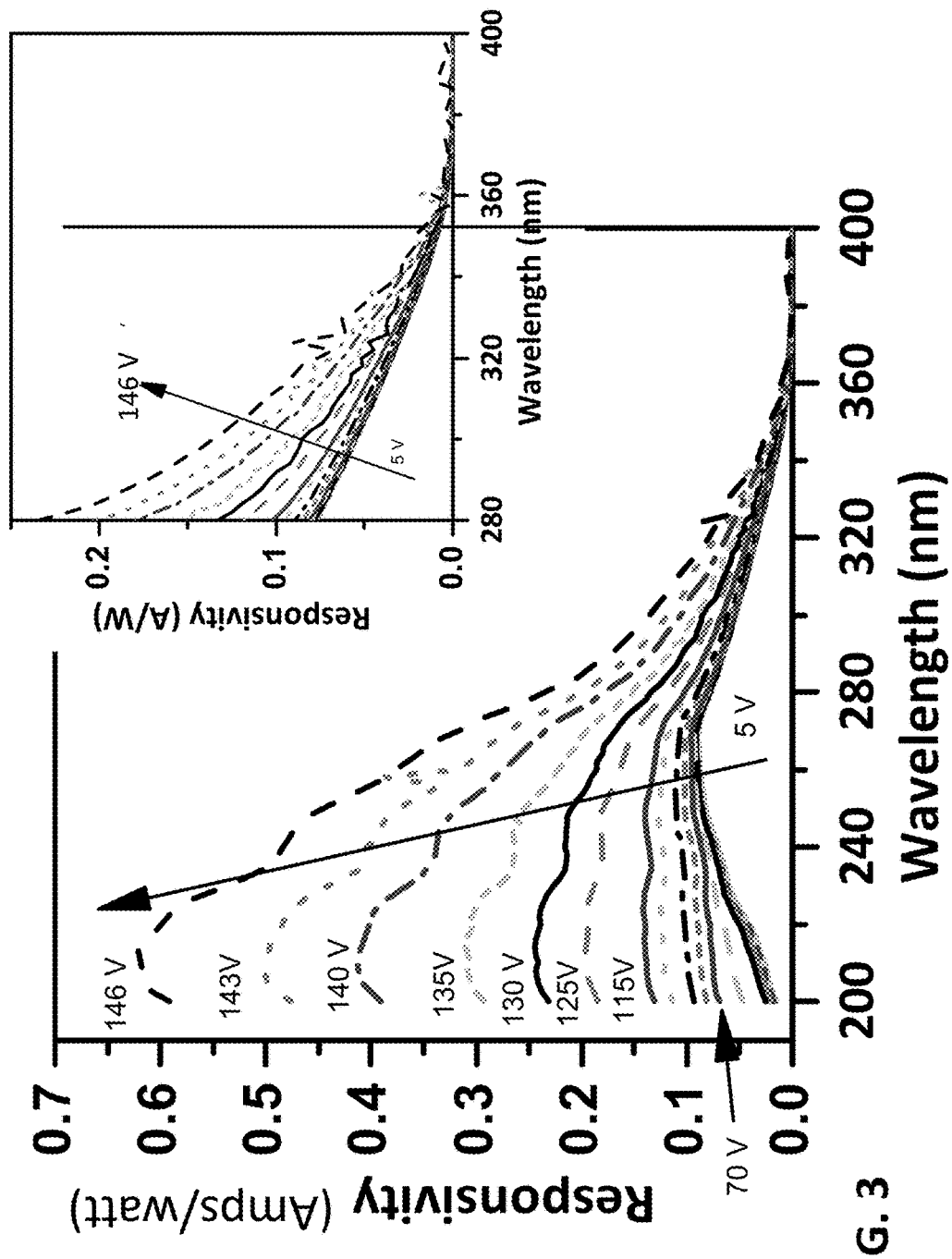
FIG. 3 is a graphical illustration of the measured photoresponse of the embodiment of FIG. 1 with increasing reverse bias. The inset of FIG. 3 (upper right) illustrates the measured responsivity between 260-380 nm with increasing bias.

FIG. 3 shows the measured spectral response from a fabricated deep ultraviolet avalanche photodetector 10 under 100 nW illumination as function of increasing reverse bias from 5 to 146V, and thus short of avalanche breakdown at ~150-160V. At low bias the photoresponse peaks at ~265 nm, corresponding to a unity-gain quantum efficiency of ~41% that is reduced due to absorption in the semi-transparent top metal contact, and drops off at shorter wavelengths. These results are typical of what is generally observed for SiC APD devices. At increasing reverse bias, the responsivity increases and the peak response shifts to ~212 nm at the highest bias investigated, i.e. 146V. This change in the shape of the spectral response can be explained by considering two phenomena that occur with increasing reverse bias, 1) the depletion of the top-illuminated n$^+$-layer and 2) the spectrally inhomogeneous gain in this structure.

Figure 4:
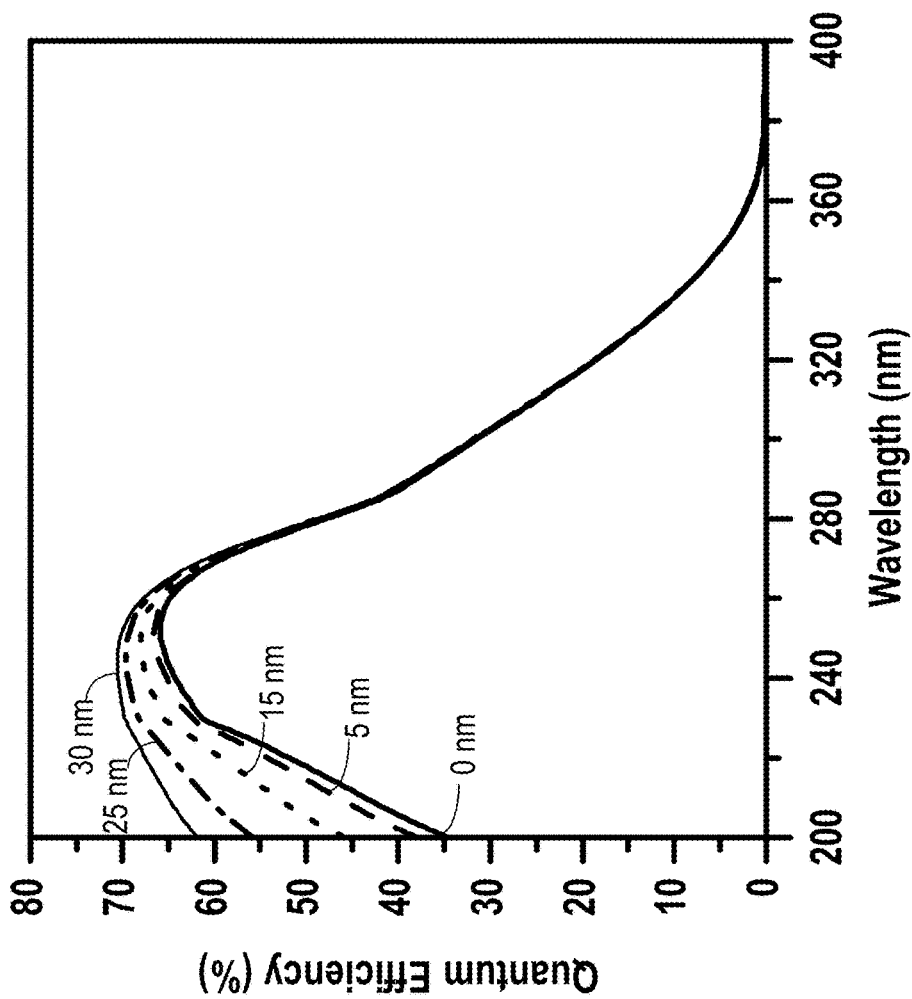
FIG. 4 is a graphical illustration obtained by calculating the expected unity-gain photo-response from an n-i-p SiC diode having a 35 nm thick illuminated n-doped region with increasing depletion of this layer.

At low reverse bias there is no increase theoretically expected in the measured photocurrent responsivity of an n-n$^-$-p diode structure due to the very low E-field within the depletion region and therefore the lack of gain associated with impact ionization. This understanding is consistent with the relatively constant response observed in the n-n⁻-p structure at wavelengths longer than ~280 nm initially with increasing reverse bias (FIG. 3 inset). However, a measurable increase in the short wavelength response even initially with increasing bias can be explained by an increase in the depletion width of the n-n⁻-p with increasing reverse bias. While both the n-side and p-side depletion width are expected to increase with increasing bias, the increase on the n-side will be larger due to the lower doping in the n-region. The increase in depletion width, primarily on the n-side, is expected to have more significant impact on the collection of carriers generated by deep ultraviolet photons that are strongly absorbed in the top illuminated n-layer, and are generally lost to surface recombination. Increasing the depletion width should enhance the DUV photoresponse by increasing the number of photo-generated holes collected through drift as well as improving the efficiency for collection of carriers generated in the neutral region by diffusion through a reduction of the distance these carrier need to diffuse through the top n-layer. This interpretation is further supported by calculating the expected quantum efficiency from an n-n⁻-p SiC diode with increasing depletion of n-layer as shown in FIG. 4. Consistent with experimentally observed trends, the response in the DUV spectral range is found to increase, while it remains relatively constant in the near ultraviolet spectral range. Further support for this explanation is found in the qualitative agreement between the measured response observed at ~70 V in the DUV-APD and that of a metal-i-p structure that has been previously reported in A. V. Sampath, L. E. Rodak, Y. Chen, Q. Zhou, J. C. Campbell, H. Shen; M. Wraback, "High quantum efficiency deep ultraviolet 4H-SiC photodetectors", *Electronics Letters*, Volume 49, Issue 25, 5 Dec. 2013, p. 1629-1630, herein incorporated by reference. It is important to note that the photoresponse of the DUV-APD was measured in the spectral range between 200-400 nm due to limitations in the experimental setup and that this device has sensitivity at wavelengths shorter than 200 nm. It is also important to note that these devices were biased short of avalanche breakdown due to limitations in the experimental test setup for probing the devices. These devices can in principle be reverse biased at or above avalanche breakdown.

Figure 5:
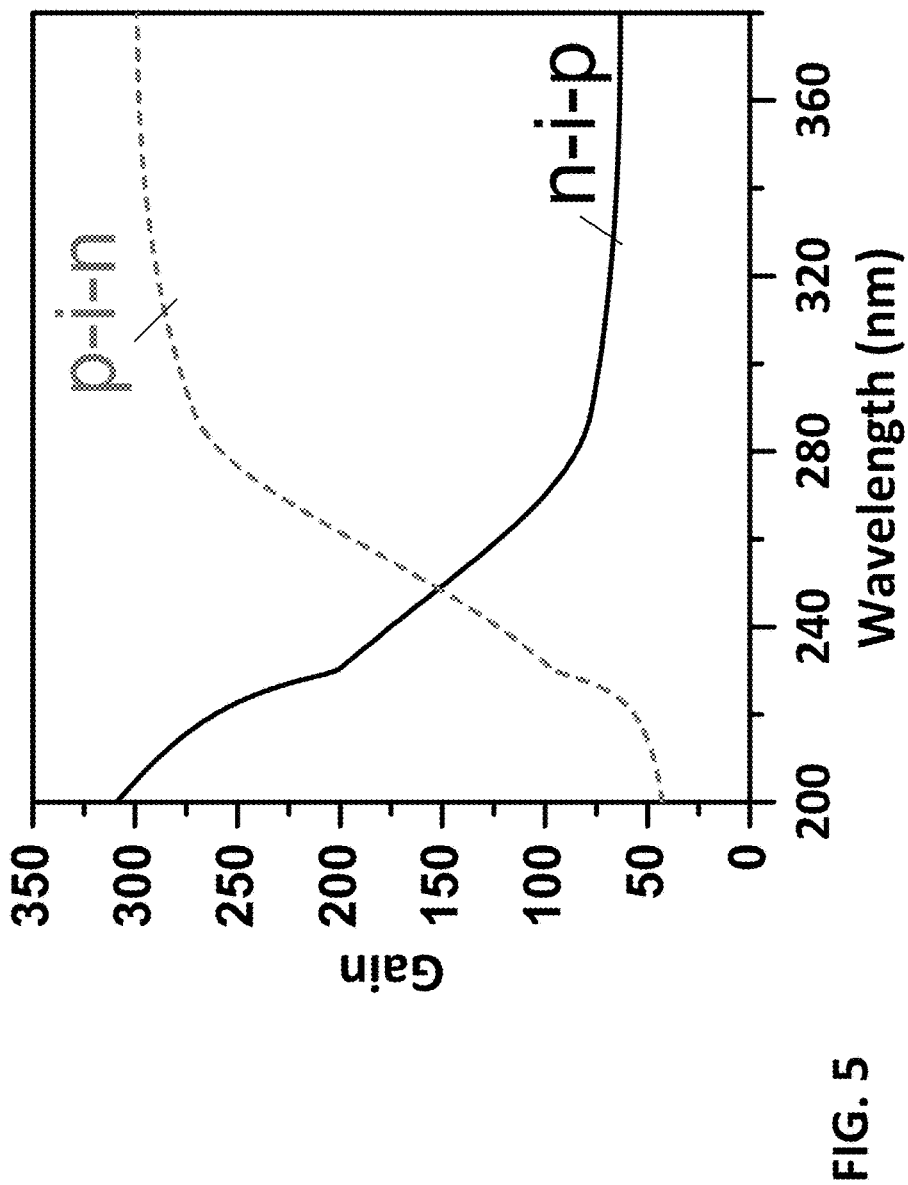
FIG. 5 graphically illustrates a calculated gain in a SiC p-i-n and n-i-p diode as a function of photon wavelength at constant reverse bias where p-i-n refers to illumination of p-layer and n-i-p refers to illumination of n-layer
Figure 6:
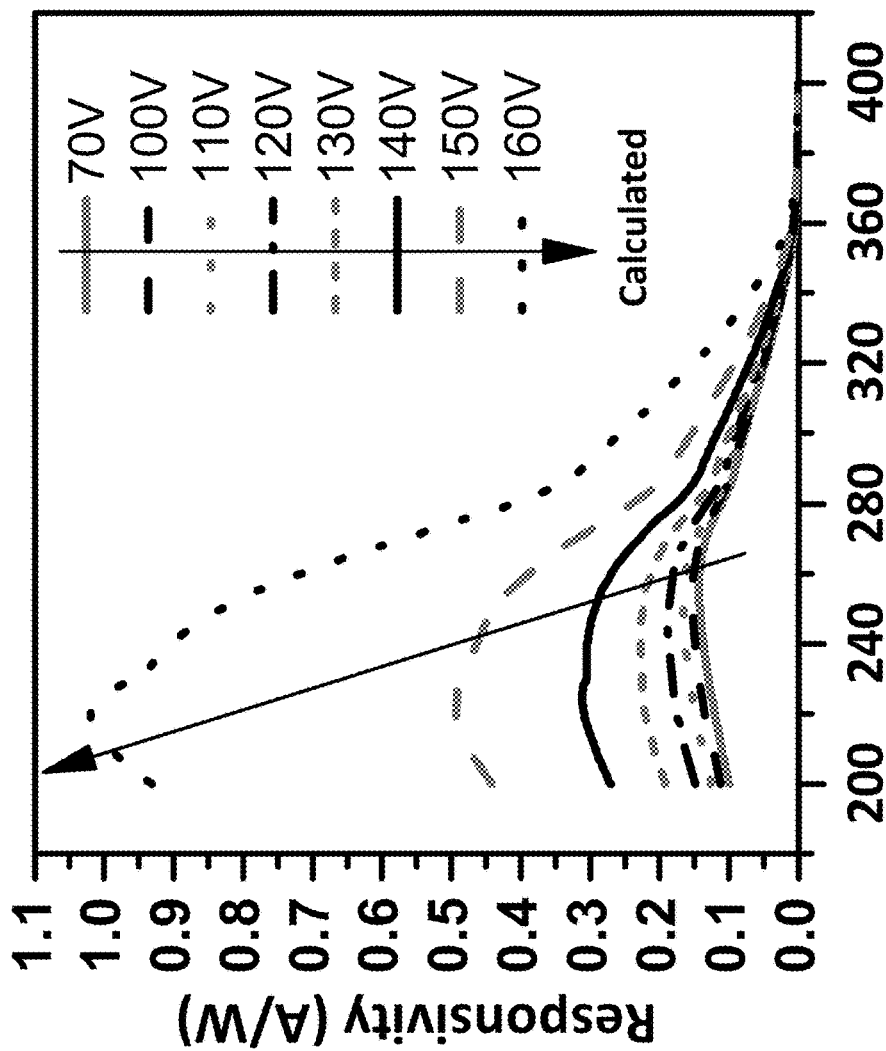
FIG. 6 illustrates the calculated responsivity in a deep ultraviolet avalanche photodetector similar to the preferred embodiment of FIG. 1 with increasing reverse bias.

For increasing bias above ~70V an increase in photoresponse is observed over a wider spectral range. This increase can be attributed to on-set of gain within the DUV-APD due to impact ionization. However, this enhancement is significantly stronger in the DUV spectral range resulting in a shift in the peak response to ~212 nm at the highest bias investigated. The spectral inhomogeneity in the observed gain can be explained by considering the ~10× larger impact ionization coefficient for holes ($\beta_p$) over electrons ($\alpha_n$) as well as the significantly stronger absorption of photons in the deep ultraviolet spectral range. Previously we have shown that the photocurrent generated in an n-i-p SiC structure (i.e. illuminated from the n-side) in the DUV spectrum is dominated by carriers generated from photons absorbed in the top-illuminated n-layer, while the near band-gap response has significant contribution from carriers generated in both the i- and bottom p-doped regions of the structure, as reported in A. V. Sampath, L. E. Rodak. Y. Chen, Q. Zhou. J. C. Campbell, H. Shen and M. Wraback, "Enhancing The Deep Ultraviolet Performance Of 4H-SiC Based Photodiodes" ECS Transactions, 61 (4) 227-234 (2014), herein incorporated by reference. As the principal carrier associated with gain for carriers photogenerated in the n-layer is a hole while that for carriers photogenerated in the p-layer is an electron, and the impact ionization coefficient of holes is ~10× that of electrons, the significantly shorter absorption length for DUV photons results in the generation of holes that have a maximized path length through the gain region. In contrast, longer wavelength photons are absorbed more uniformly throughout the structure, resulting in gain from a mix of photogenerated electrons and holes traveling, on average, a shorter distance that necessarily results in lower gain. A calculation on the gain expected for an n-side (n-i-p) and a p-side illuminated (p-i-n) SiC diode having a 480 nm thick i-region demonstrates this trend, as shown in FIG. 5. The "spectrally inhomogeneous gain" shown in FIG. 5 results from gain arising primarily from impact ionization multiplication of holes and their spatial distribution in the device structure associated with the wavelength dependent absorption depth for photogeneration of carriers. The absorption depth refers to a thickness within a layer wherein 1−1/e (e=natural logarithm=0.368); i.e., approximately 63% of the photons at the detection wavelength of interest are absorbed according to Beer's Law. For an n-i-p structure, the gain at 200 nm is ~310 while at 360 nm it is ~75. In contrast for a p-i-n structure the opposite is the case, gain at 360 nm is ~6× greater than gain at 200 nm. This phenomena is related to 1) the ionization rate of the principal carrier that is being multiplied in the gain region and 2) where the photons are absorbed within the structure, which effects the distance photogenerated carriers travel inside the gain region. As holes have a higher ionization rate than electrons in 4H-SiC and deep ultraviolet photons are absorbed very close to the surface, carriers generated by photons at these wavelengths have higher gain in the n-i-p structure. This phenomenon is partially responsible for the emerging 212 nm peak observed in FIG. 3 at biases above 130V. Calculation of the expected response in our DUV-APD shown in FIG. 6 demonstrates the same trends observed experimentally at high bias near avalanche breakdown. Specifically, the near flat spectral response observed at moderate bias over a wide spectral range from 200-280 nm becomes a more peaked response around 220 nm.

The operating reverse bias point for the photodiode will generally be application specific. For applications requiring high sensitivity, the diode may be biased to have high gain in the multiplication layer 12. For operation in a single photon counting mode, the diode may be operated near or above the avalanche breakdown voltage. This corresponds to an E-field in the multiplication region 12 of ~2-3 MV/cm for SiC or a reverse bias of ~150V for a 500 nm thick region 12. The doping in this region will generally be sufficiently low to allow for a large and uniform electric field throughout such as n=1×10¹⁶ cm⁻³ for the photodiode 60.

The thickness and doping of the illuminated n-region 11 will be designed so that it is sufficiently depleted at the reverse bias operating point such that DUV photons are absorbed within this region. However, region 11 cannot be biased to full depletion as this will cause a large increase in dark current in the photodiode that can reduce detector performance. For photodiode 10 the n-region preferred thickness range is between 20-120 nm and preferred n-type doping range in this region is 9×10¹⁷ to 5×10¹⁸ cm⁻³. The thickness of the n-layer 12 may be varied to modify the gain and dark current within the diode for a given reverse bias. The thickness of the n-layer 12 may range from 250 nm to 960 nm, with the lower end of the range resulting in reduced reverse bias required for avalanche breakdown but likely reduced gain and increased dark current. In contrast, the higher end of the range will likely result in higher gain and lower dark current but with a higher reverse bias required for avalanche breakdown.

Figure 7:
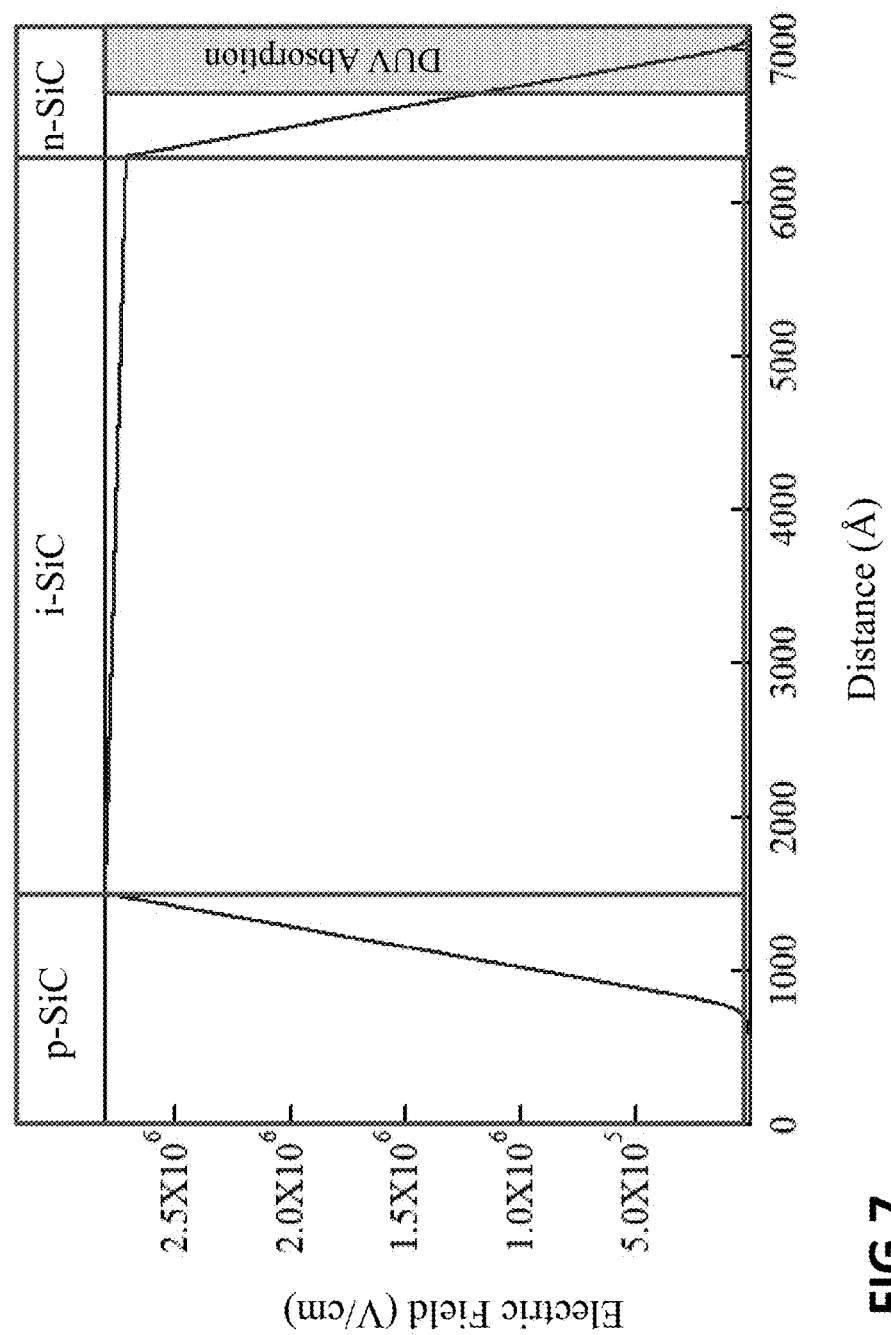
FIG. 7 illustrates the Electric Field distribution in a deep ultraviolet avalanche photodetector similar to the preferred embodiment of FIG. 1. The depth for full absorption of representative DUV photons to be detected within the n-i-p structure is shown by the shaded region.

One advantage of this design is the low noise in the DUV spectrum that is expected due to the spatial separation of the absorption and multiplication regions in the structure for photons in this spectral range, as illustrated in FIG. 7. As DUV photons are primarily absorbed and photocarriers generated in the lower E-field n$^+$-region 11 of this structure due to strong absorption in this spectral range, while carrier multiplication primarily occurs in the n$^-$-SiC region 12, single carrier hole multiplication can be achieved in this wavelength range due to the long transit path of holes through the high electric field multiplication region, as compared to electrons, which have a significantly shorter path primarily through a diminishing electric field in the n$^+$-SiC region. As a result, this structure should yield lower excess noise for operation in this spectral range without the use of a thick doped charge layer traditionally employed in a separate absorption charge multiplication avalanche photodiode, which can result in loss of detection efficiency resulting from diffusive transport in this region. See, for example, S. Soloviev, A. Vert, J. Fronheiser, P. Sandvik, "Positive Temperature Coefficient of Avalanche Breakdown Observed in a-Plane 6H-SiC Photodiodes," *Materials Science Forum Vols.* 615-617 (2009) pp 873-876, herein incorporated by reference.

Moreover, the replacement of the semi-transparent window metal required to improve the lateral E-field spreading in the current structure with a conductive and transparent wide band gap n-type semiconductor such as AlGaN should improve on the unity gain quantum and single photon detection efficiencies of the current demonstrated device. The structure of this improved heterostructure is shown in FIG. 8.

As described in US 2015/0311375 paragraph 57, the use of $Al_xGa_{(1-x)}N$ alloys as a transparent n-type window increases the collection of electrons created by absorption of high energy photons in the high-field n$^-$-SiC region. Peak QE of 76% at 242 nm has been measured and attributed to the minimization of the effects of surface states and absorption in heavily doped layers currently hindering homogeneous SiC devices.

Figure 14:
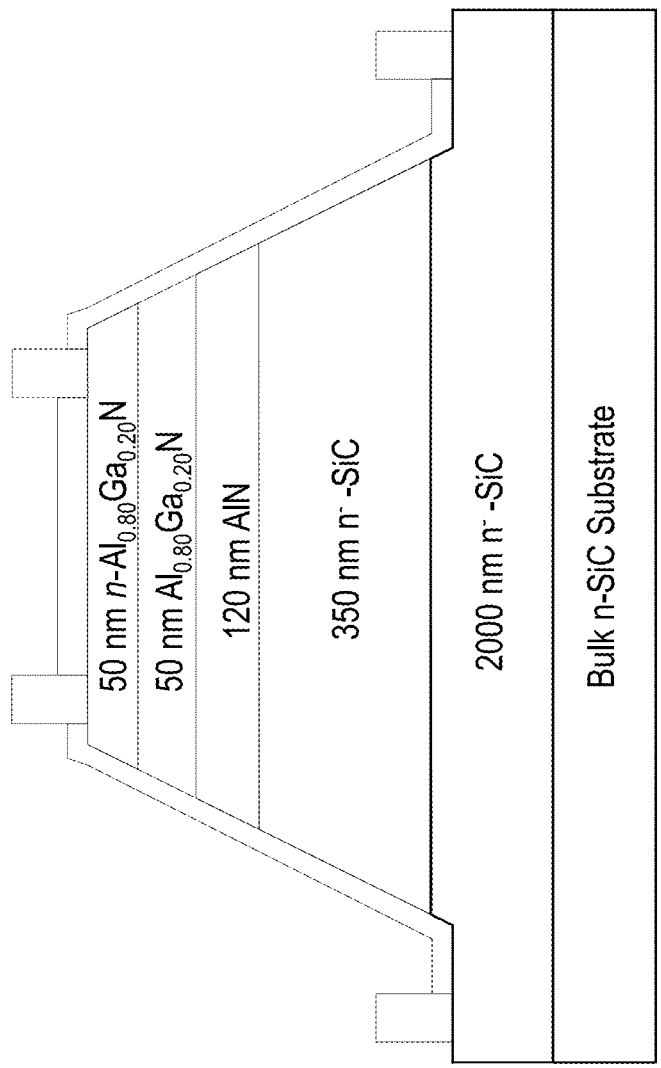
FIG. 14 is a schematic illustration of a SiC/AlN/Al$_x$Ga$_{(1-x)}$N nip photodiode demonstrating enhanced DUV photoresponse.
Figure 15:
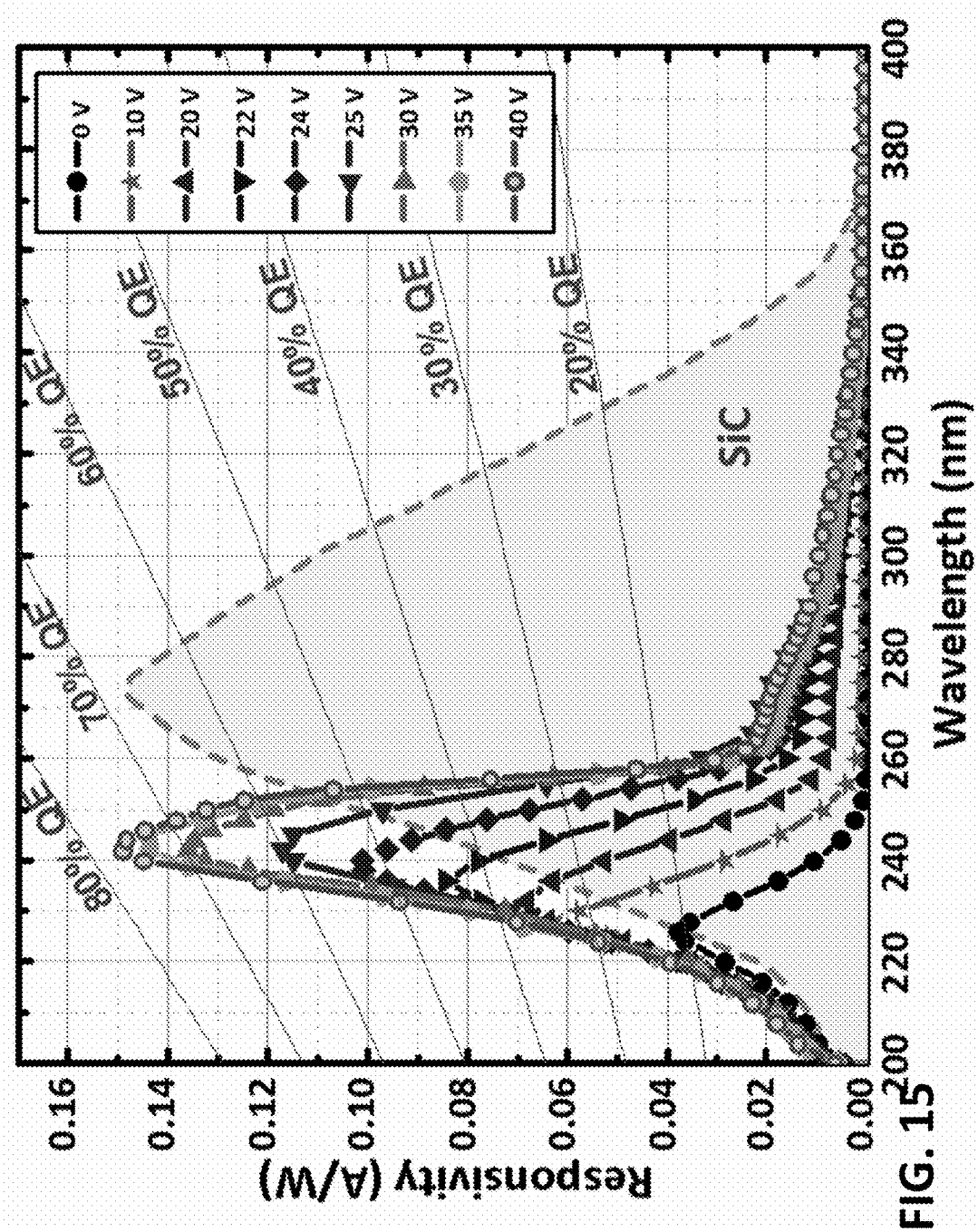
FIG. 15 is the measured DC spectral response of SiC/AlN/Al$_x$Ga$_{(1-x)}$N nip photodiode at varying reverse bias voltage (closed figures). The DC spectral response for a homogeneous SiC pin photodiode is shown for comparison (dashed line).

US 2015/0311375 discusses a SiC/AlN/$Al_xGa_{1-x}N$ nip photodiode as shown in FIG. 14 where the diode is illuminated through the n-$Al_xGa_{1-x}N$ layer. These diodes exhibit a peak QE of 76% at 242% that is significantly larger than that of a conventional homogenous n-i-p SiC diode with a thick illuminated n-layer as shown in FIG. 15. This has been attributed to the reduction of the losses of carriers generated by these DUV photons to recombination via surface states in the traditional n-i-p-SiC or p-i-n-SiC APD structure, where these carriers are generated in the illuminated highly doped layer and are collected primarily through diffusion. The presence of surface states and the associated surface band bending acts to significantly reduce the effective diffusion length of these carriers so that they are lost to surface recombination. See, for example, A. V. Sampath, L. E. Rodak, Y. Chen, Q. Zhou, J. C. Campbell, H. Shen; M. Wraback, "High quantum efficiency deep ultraviolet 4H-SiC photodetectors", *Electronics Letters*, Volume 49, Issue 25, 5 Dec. 2013, p. 1629-1630. Instead, the wider band gap illuminated n-$Al_xGa_{(1-x)}N$ and AlN layers enables these photons to be absorbed in the high E-field, low doped, n$^-$-SiC region where they are collected more efficiently by drift resulting in significant enhancement in DUV photoresponse. See, for example, L. E. Rodak, A. V. Sampath, C. S. Gallinat, Y. Chen, Q. Zhou, J. C. Campbell, H. Shen, and M. Wraback. "Solar-blind $Al_xGa_{1-x}N$/AlN/SiC photodiodes with a polarization-induced electron filter." *Applied Physics Letters* 103, no. 7 (2013): 071110, herein incorporated by reference.

Figure 8:
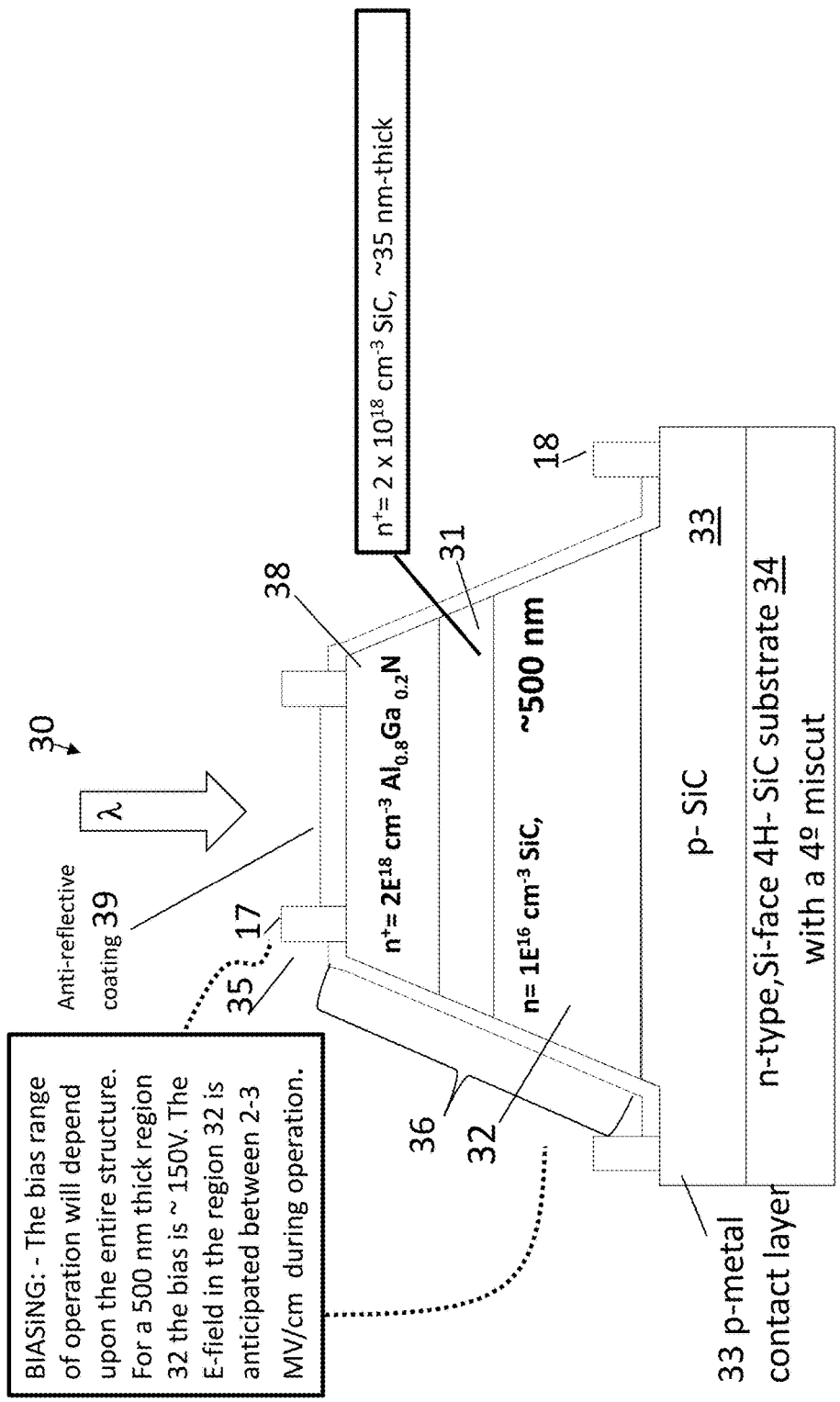
FIG. 8 is an illustration of an alternate preferred embodiment comprising a transparent n-type doped AlGaN layer operatively connected to an n-n--p-SiC diode of the present invention.

FIG. 8 shows a schematic of an alternate preferred embodiment n$^+$-$Al_xGa_{1-x}N$/n-n$^-$-p-SiC structure 30 comprising an approximately 100 nm thick n$^+$-AlGaN layer 38 having an AlN mole fraction of ~80% and doped with $5\times10^{18}$ cm$^{-3}$ silicon atoms, a 35 nm thick n$^+$-SiC layer 31 doped with $2\times10^{18}$ cm$^{-3}$ nitrogen atoms, a 480-500 nm thick n$^-$-SiC layer 32 doped with $1\times10^{16}$ cm$^{-3}$ nitrogen atoms and a 2000 nm thick p-SiC layer 33 doped with an aluminum concentration of $2\times10^{18}$ cm$^{-3}$. The structure is grown on an n-type, Si-face, 4H-SiC substrate 34 with a 4° miscut. Avalanche photodiode devices with 50-250 μm-diameter circular mesas 35 and seven degree beveled sidewalls 36 were fabricated. The top n-type metal contact 37 comprises a Ti 10 nm/Al 100 nm/Ni 30 nm/Au 50 nm metallization scheme while the p-SiC Ohmic contact 38 comprises Ni 25 nm/Ti 35 nm/Al 100 nm/Ni 80 nm. An anti-reflective coating 39 was deposited in the window region to minimize losses associated with reflection of the illuminated light from the semiconductor surface.

The alternate preferred embodiment of the present invention shown in FIG. 8 comprises a heterostructure operable to extend the deep ultraviolet (DUV) response of SiC below 260 nm. Since the direct bandgap of aluminum gallium nitride ($Al_xGa_{(1-x)}N$) can be engineered from 3.4 eV to 6.1 eV depending on the AlN to GaN mole fraction, these alloys are employed as UV transparent, n-type contact windows (for example, the transparent window in FIG. 8) to increase the absorption of high energy photons and concomitant photogeneration of carriers in the high electric field depletion region of the nip structure, as compared to the previously described structure with the semi-transparent metal contact that reduces the photon flux absorbed within the detector due to losses in the illuminated semi-transparent metal contact. As described in the following, photo-generated carriers in the $Al_xGa_{(1-x)}N$ windows do not contribute to photoresponse and can therefore be used to adjust the high energy cutoff wavelength of this device. See, for example, L. E. Rodak, A. V. Sampath, C. S. Gallinat, Y. Chen, Q. Zhou, J. C. Campbell, H. Shen, and M. Wraback. "Solar-blind $Al_xGa_{1-x}N$/AlN/SiC photodiodes with a polarization-induced electron filter." *Applied Physics Letters* 103, no. 7 (2013): 071110, herein incorporated by reference.

Figure 16:
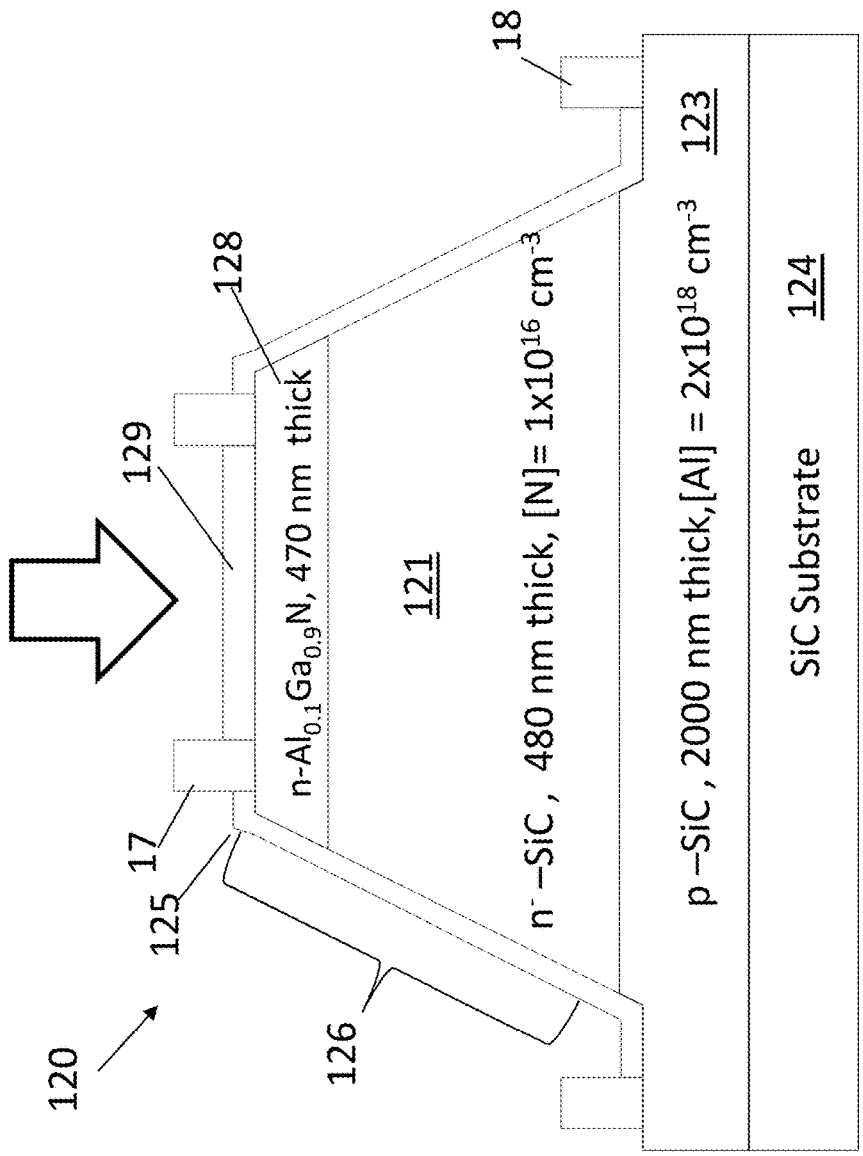
FIG. 16 is an illustration of an alternate preferred embodiment n-AlGaN/n-SiC/p-SiC photodiode employing an n-AlGaN transparent window layer

Preferred thickness range of the n-type AlGaN contact window layer is between ~50-600 nm thick. The Al composition is preferably greater than 60% to insure transparency in the deep ultraviolet spectral range between 200-260 nm. The n-type AlGaN having a ratio of aluminum to gallium of greater than 80%, The n-type AlGaN preferably has a free electron concentration from $1\times10^{17}$ cm$^{-3}$ to $1\times10^{19}$ cm$^{-3}$ and having a thickness between 50-470 nm This enhancement of the DUV response using a transparent window semiconductor is more clearly demonstrated in a device structure that does not have the barrier layer such as a p-i-SiC/n-$Al_xGa_{1-x}N$ photodiodes. FIG. 16 shows a schematic of an alternative preferred embodiment comprising an approximately 470 nm-thick n-$Al_xGa_{1-x}N$ layer 128 having ~90% AlN by mole fraction, a 480-500 nm thick n$^-$-SiC layer 121 doped with $1\times10^{16}$ cm$^{-3}$ nitrogen atoms and a 2000 nm thick p-SiC layer 123 doped with an aluminum concentration of $2\times10^{18}$ cm$^{-3}$. The structure is grown on an n-type, Si-face, 4H-SiC substrate 124 with a 4° miscut. Avalanche photodiode embodiments 120 with 50-250 μm-diameter circular mesas 125 and seven degree beveled sidewalls 126 were fabricated. The top n-type metal contact 17 comprises a Ti 10 nm/Al 100 nm/Ni 30 nm/Au 50 nm metallization scheme while the p-SiC Ohmic contact 18 comprises Ni 25 nm/Ti 35 nm/Al 100 nm/Ni 80 nm. An anti-reflective coating 129 was deposited in the window region to minimize losses associated with reflection of the illuminated light from the semiconductor surface. For comparison, a 4H-SiC homojunction avalanche photodiode employing an illuminated recessed window to improve the EQE is provided from Handin Liu, Dion Mcintosh, Xiaogang Bai, Member, IEEE, Huapu Pan, Mingguo Liu, and Joe C. Campbell. "4H-SiC PIN Recessed-Window Avalanche Photodiode with High Quantum Efficiency" IEEE PHOTONICS TECHNOLOGY LETTERS 20, NO. 18, (2008) 1551. This SiC APD structure consists of a 2 μm-thick n+ ($4.5 \times 10^{18}$ cm$^{-3}$) layer, a 480 nm-thick p– ($N_a = 1 \times 10^{16}$ cm$^{-3}$) layer, a 200 nm p ($N_a = 2 \times 10^{18}$ cm$^3$) layer, and a 200 nm p+ ($N_a = 1 \times 10^{19}$ cm$^{-3}$) layer; the thickness of the top layer was reduced to ~35 nm in the illuminated window through dry etching to reduce absorption in this region. The III-Nitride heterojunction and SiC homojunction devices were passivated with 200 nm and 220 nm thick silicon dioxide layers, respectively, which also act as an anti-reflection coating.

Figure 17:
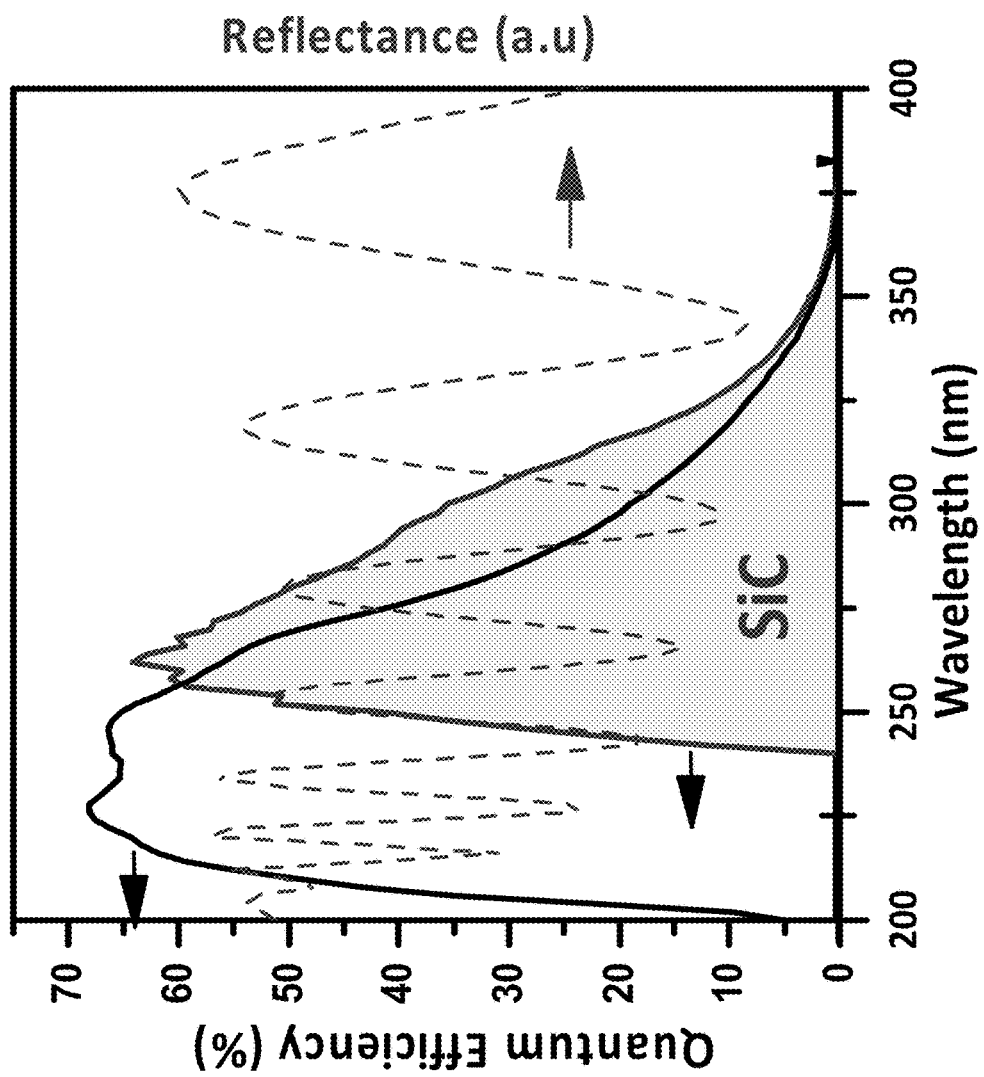
FIG. 17 is a plot of the measured photoresponse for the fabricated n-AlGaN/n-SiC/p-SiC photodiode demonstrating enhanced deep ultraviolet response over a homogenous SiC p-i-n diode employing an illuminated recessed window.
Figure 18:
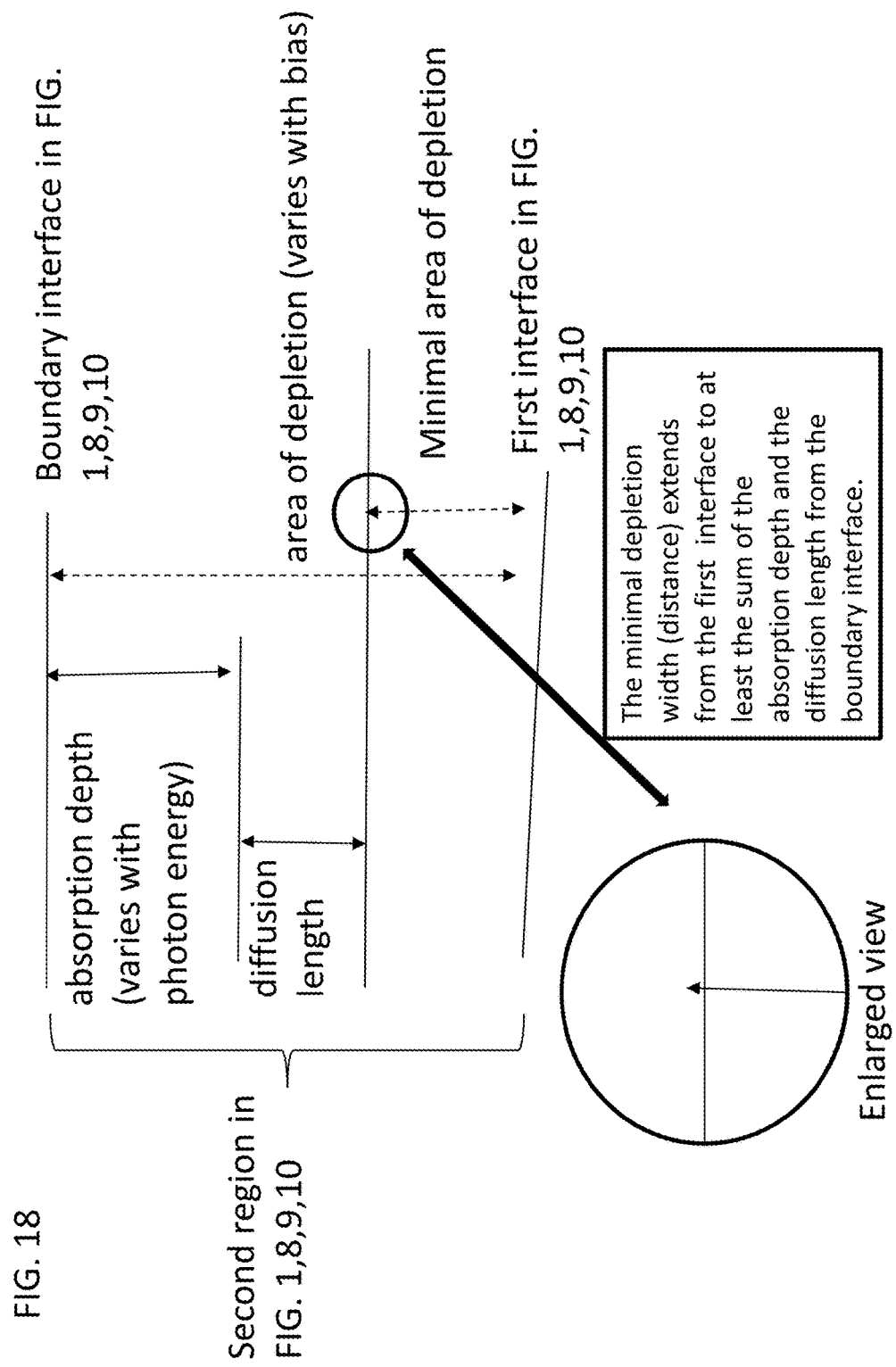
FIG. 18 is a schematic diagram depicting the absorption depth, effective diffusion length and the depletion width.

The photoresponse of the p-i-SiC/n-$Al_xGa_{1-x}N$ and homogenous SiC photodiodes are shown in FIG. 17. The recessed window SiC photodiode has a peak EQE of ~60% at 260 nm and a sharp drop off in response at shorter wavelength (grey shaded curve). In contrast, the p-i-SiC/n-$Al_xGa_{1-x}N$ photodiode has a flatter response in DUV that exceeds 60% over a spectral range from 215-256 nm and a sharp cut-off at shorter wavelengths (black curve). This enhancement is a ~10× enhancement in performance over comparable homogenous SiC photodiodes at the shortest wavelength and is attributed to the photogeneration of carriers within the depletion region of the heterojunction, where these carriers are more efficiently collected through drift over a typical p-i-n SiC photodiode structure that strongly relies on carrier diffusion.

The sharp short wavelength cutoff observed at 210 nm is attributed to the loss of photogenerated carriers within the neutral n-$Al_xGa_{1-x}N$ "window" layer; this results from the short effective carrier diffusion lengths within this region associated with the presence of dislocations arising from lattice mismatch inhibits the collection of photo-generated carriers through diffusion. This conclusion is consistent with what we have previously observed for the collection of photo-generated carriers within the GaN absorption region of a GaN/SiC separate absorption and multiplication APD, for which drift in an electric field is required. Anand V. Sampath, Ryan W. Enck, Q. Zhou, D. C. McIntosh, H. Paul Shen, J. C. Campbell, and Michael Wraback, "p-type Interface Charge Control Layers for Enabling GaN/SiC Separate Absorption and Multiplication Avalanche Photodiodes", Applied Physics Letters, 101, (2012) 093506 This is further supported by measurement of the reflection spectrum from the heterojunction shown in FIG. 17 where the damping of the reflection oscillation associated with absorption in the n-$Al_xGa_{1-x}N$ layer correlates well with drop off in the short wavelength response of the heterojunction photodiode.

An additional benefit of an N-n-n--p structure such as n+-AlGaN/n-n$^-$-p-SiC is that the n-type AlGaN layer (the N-layer) can be made arbitrarily thick to improve lateral conductivity and lateral electric field spreading that will improve uniformity over the detection area while also preventing punch-through of the E-field to the top metal contact. The presence of the n$^+$-SiC layer will reduce the electric field at the hetero-interface and can potentially result in reduced dark current generation associated with heteroepitaxially generated defects. This may also make the structure more easily manufacturable, as the tolerances for designing the top n+-region for optimal DUV efficiency over a comparable n$^+$-n$^-$-p-SiC structure as shown in FIG. 1 while avoiding the metal contact punch-through effect would be relaxed.

For photodiode 30 the thickness and doping of the n-region 31 will be designed so that it is either fully depleted to the interface with the transparent window 38 or sufficiently depleted at the reverse bias operating point such that DUV photons are absorbed within this region. The depletion width in photodiode 30 would minimally extend from its interface with the multiplication region 32 to at least within a distance of its interface with the transparent window layer 38 that is equal to either 1) and absorption depth for the predetermined energy range or 2) the sum of the absorption depth for the predetermined energy range and the effective diffusion length of carriers For photodiode 30 a preferred n-layer 31 thickness is between 20-120 nm and preferred n-type doping range is $9 \times 10^{17}$ to $5 \times 10^{18}$ cm$^{-3}$.

However, it should be noted that use of the n-type AlGaN transparent window can reduce the thickness of or eliminate the need for the more heavily doped n+-SiC layer as in preferred embodiment 120.

The operating reverse bias point for this photodiode will generally be application specific. For applications requiring high sensitivity, the diode may be biased to have high gain in the multiplication layer 32. For operation in a single photon counting mode, the diode may be operated near or above the avalanche breakdown voltage. This corresponds to an E-field in the multiplication region 32 of ~2-3 MV/cm for SiC or a reverse bias of ~150V for a 500 nm thick region 32. The doping in this region will generally be sufficiently low to allow for a large and uniform electric field throughout such as n=$1 \times 10^{-16}$ cm$^{-3}$ for the photodiode 30.

While the preceding has focused on SiC and the collection of carriers generated by photons having energies corresponding to wavelengths shorter than 260 nm, the underlying principles are applicable to any semiconductor having a large surface recombination velocity and potentially a large surface band bending and where the carriers to be collected are generated near the surface of material. In this case, it is desirable to design the thickness and doping levels of the illuminated semiconductor layer such that this layer is sufficiently depleted so that the thickness of the remaining neutral and quasi-neutral regions are reduced to become near or shorter than the absorption depth of the photon to be detected at the reverse bias operating point of interest for the detector. This results in the beneficial case where carriers generated by these photons may be collected more efficiently through 1) drift within the depletion region and/or 2) reduced distance for carriers to diffuse from the illuminated neutral and quasi-neutral regions to the depletion region for collection. As a result, the performance of the detector will improve in the spectral range of interest. As the neutral and quasi-neutral region of the illuminated layer thickness reduces, the lateral conductance of the layer may decrease so as to prevent uniform lateral electric field spreading across the detection area of the photodetector. In this case, a semi-transparent metal contact layer can be deposited in the illumination area of the detector to improve the lateral electric field spreading. Another approach is to employ a sufficiently conductive semiconductor that is transparent in the spectral range of interest and make a metal contact to it around the periphery of the detection area to prevent absorption losses within the metal. The design choice of illuminating the n- or p-layer will be made based upon a number of consideration such as whether a particular carrier, electron or hole, has the higher ionization rate.

Figure 9:
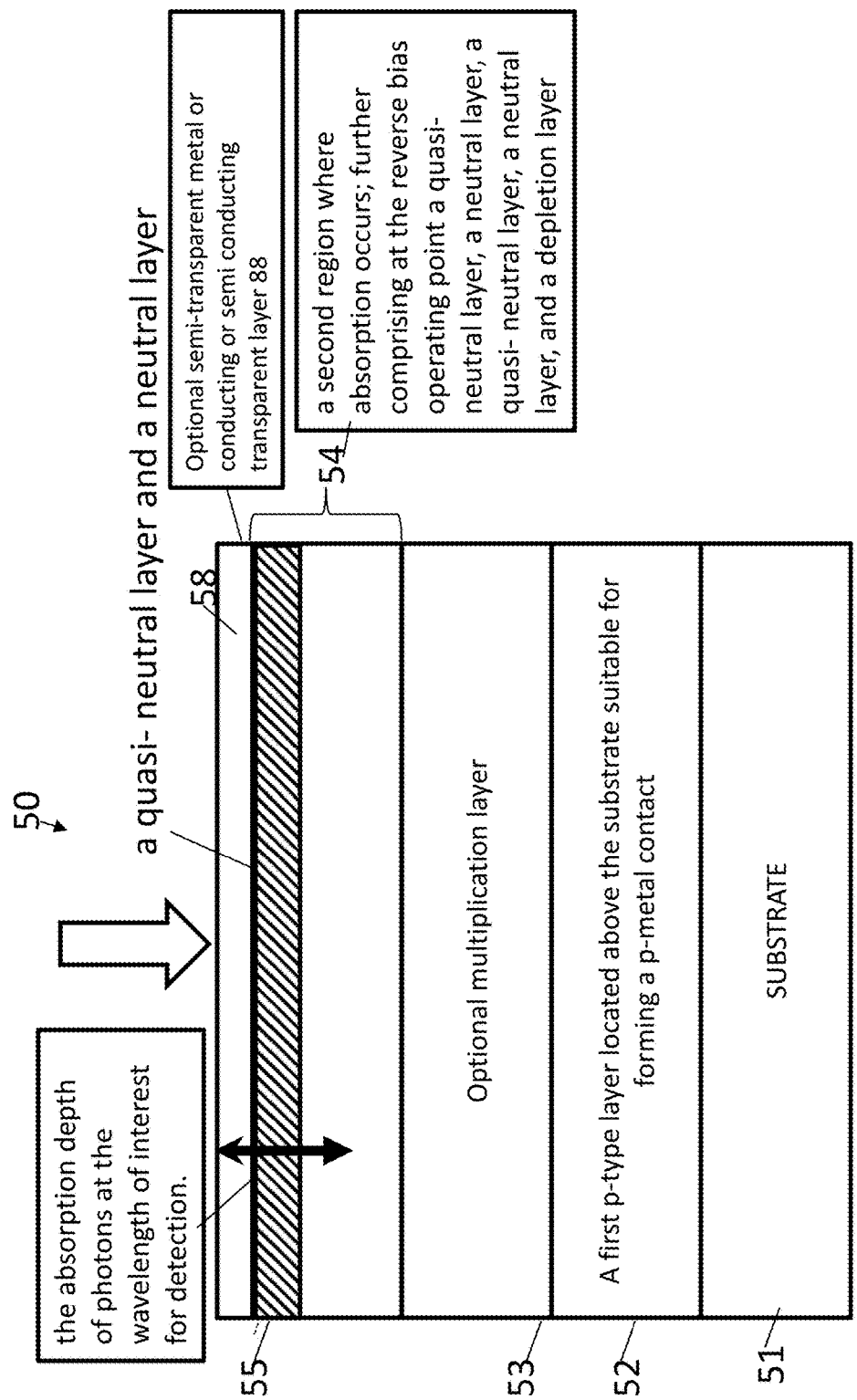
FIG. 9 is an illustration of an alternate preferred embodiment comprising a p-type layer adjacent to the substrate showing the neutral and quasi-neutral regions within the illuminated n-type layer.

A schematic of such a device is shown in FIG. 9 for a device comprising a preferred embodiment n-n⁻-p structure 50 deposited upon a substrate 51 and where the second region n-layer 54 is illuminated with light. Optional multiplication layer 52 between the first and region is shown for when photodiode 50 is designed to have gain. It further comprises a first layer 52 that is doped p-type and suitable for making a metal contact. While not shown, it is assumed that the device is properly reverse biased at the operating point of interest for detection. For example, the device may be biased below the avalanche breakdown voltage and operating in linear mode with or without gain or Geiger mode. Alternatively the device may be biased above the avalanche breakdown voltage as is commonly done in Geiger mode to improve single photon detection efficiency. At this reverse bias the illuminated n-layer 54 will partially deplete so that the thickness of neutral and quasi-neutral region 55 within will be thinner than that of the n-layer 54. Since the width of the neutral and quasi-neutral region 55 will now be near or shorter than the absorption depth of the photon of interest for detection, the carriers generated by absorption of these photons will be more efficiently collected. The absorption depth refers to a thickness within a layer wherein 1−1/e (e=natural logarithm=0.368); i.e., approximately 63% of the photons at the detection wavelength of interest are absorbed according to Beer's Law. The depletion width in photodiode 50 would minimally extend from its interface with the first layer 51/optional multiplication region 52 to at least within a distance of its interface with its boundary/the optional transparent window layer 58 that is equal to either 1) and absorption depth for the predetermined energy range or 2) the sum of the absorption depth for the predetermined energy range and the effective diffusion length of carriers This is due to more efficiently collecting these carriers through drift and/or the reduced length that carriers need to diffuse to the depletion region to be collected as current in the detector. As the lateral resistance of the neutral and quasi-neutral region 55 may now be large so as to prevent a uniform lateral electric field distribution across the device area, an optional transparent semiconductor or semi-transparent metal 58 is shown adjacent the illuminated n-layer 54. If a transparent wider band gap semiconductor is employed, then the structure can be described as an N-n-n⁻-p diode where the capital N is used to refer to the wider band gap semiconductor layer. It is important to note that in general the doping of n-layer 54 can vary with thickness such that it increases from it interface with the p-layer 52/optional multiplication region 53 to its boundary/interface with optional layer 58. This increase may be of some arbitrary function such as for example linear, continuous, graded, abrupt, step or some combination of these.

Figure 10:
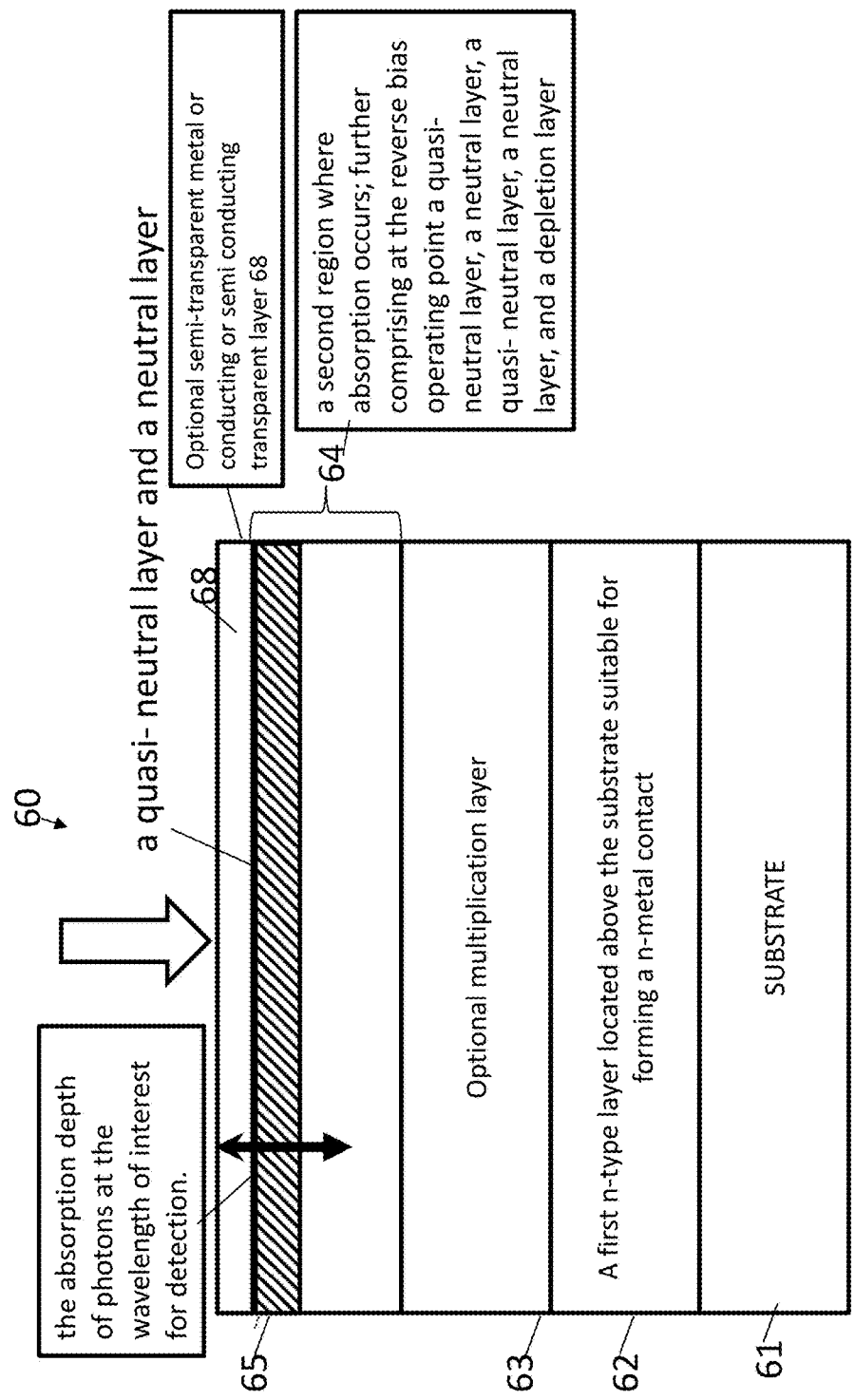
FIG. 10 is an illustration of an alternate preferred embodiment comprising an n-type layer adjacent to the substrate showing the neutral and quasi-neutral regions within the illuminated p-type layer.
Figure 11:
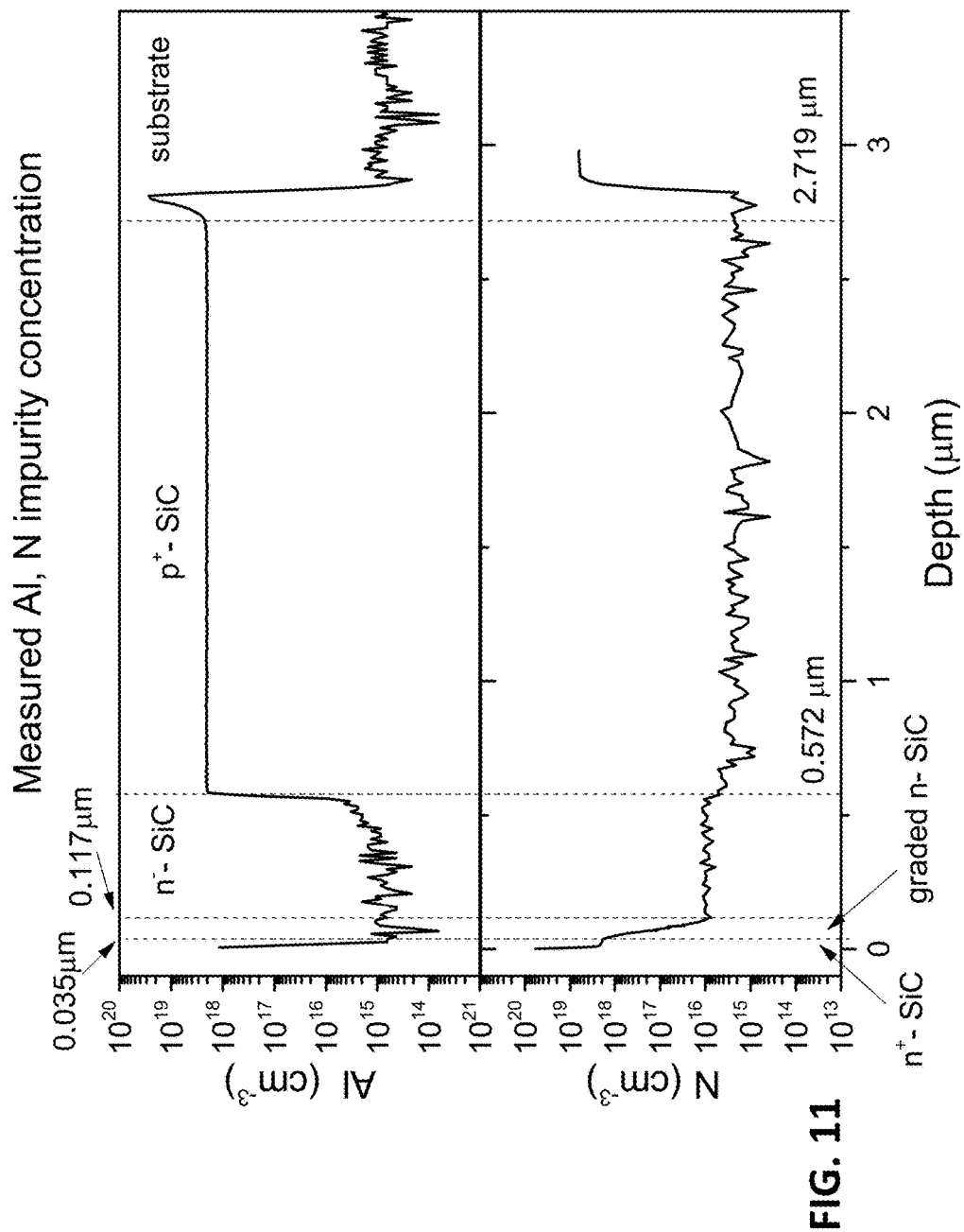
FIG. 11 is a measured doping profile for a preferred embodiment comprising an illuminated n-type layer with graded or varying Nitrogen doping with layer thickness.

This approach can also be employed for an alternate preferred embodiment p-p⁻-n structure 60 where the p-type doped second layer 64 is now illuminated as shown in FIG. 10. The structure 60 includes a substrate 61 and an optional layer 63 where multiplication occurs and an n-type first layer 62 suitable for making a metal contact. This case is analogous to the previous case except that the types of doping in the illuminated layer and region adjacent the substrate are now switched. While not shown, it is assumed that the device is properly biased at the operating point of interest for detection.

The choice of which structure to employ may be influenced by the semiconductor material selected and its properties. For example, as the ionization rate of holes is ~10× larger than that of electrons for 4H-SiC an illuminated n-layer is desirable to fully absorb photons having energies much greater than the band gap and generate holes for multiplication within the multiplication region of the avalanche photodiode. However for silicon, that also has a high density of surface states, the ionization rate of electrons is ~100× greater than that of holes so that an illuminated p-layer is likely more desirable.

Lastly, the use of a doped and conductive wider band gap semiconductor in the illuminated layer within a heterojunction N-n⁻-p or P-p⁻-n can greatly reduce complexity of design, where by convention the capital letter refers to the wider band gap semiconductor material. This is due to the fact that the wider band gap layer may be selected so as to be transparent to the photons at the short wavelength range of interest such that the photons are absorbed in the high electric field i-region near the hetero-interface. As a result, the carriers generated by photons in the short wavelength range of interest will be collected more efficiently by drift over a comparable homojunction detector. For the case of polar semiconductors such as AlGaN and SiC there is also an advantage associated with positive polarization induced charge at the AlGaN/SiC heterointerface in a n-AlGaN/n⁻-SiC/p-SiC heterojunction detector, as it will act to prevent the depletion of the n-AlGaN layer and prevent punch-through to the metal contact. However, as lattice mismatch at hetero-interfaces can result in the generation of defects that can result in deleterious dark current, the use of the n-layer in the N-n-n⁻-p (or correspondingly the p-layer in a P-p-p⁻-n) can act to suppress these effects by reducing the electric field at the hetero-interface. This design may also have lower excess noise due to the spatial separation of the principal absorption region (the n-layer for an N-n-n⁻-p) and the multiplication region (the n⁻-layer for an N-n-n⁻-p) within the diode.

Figure 12:
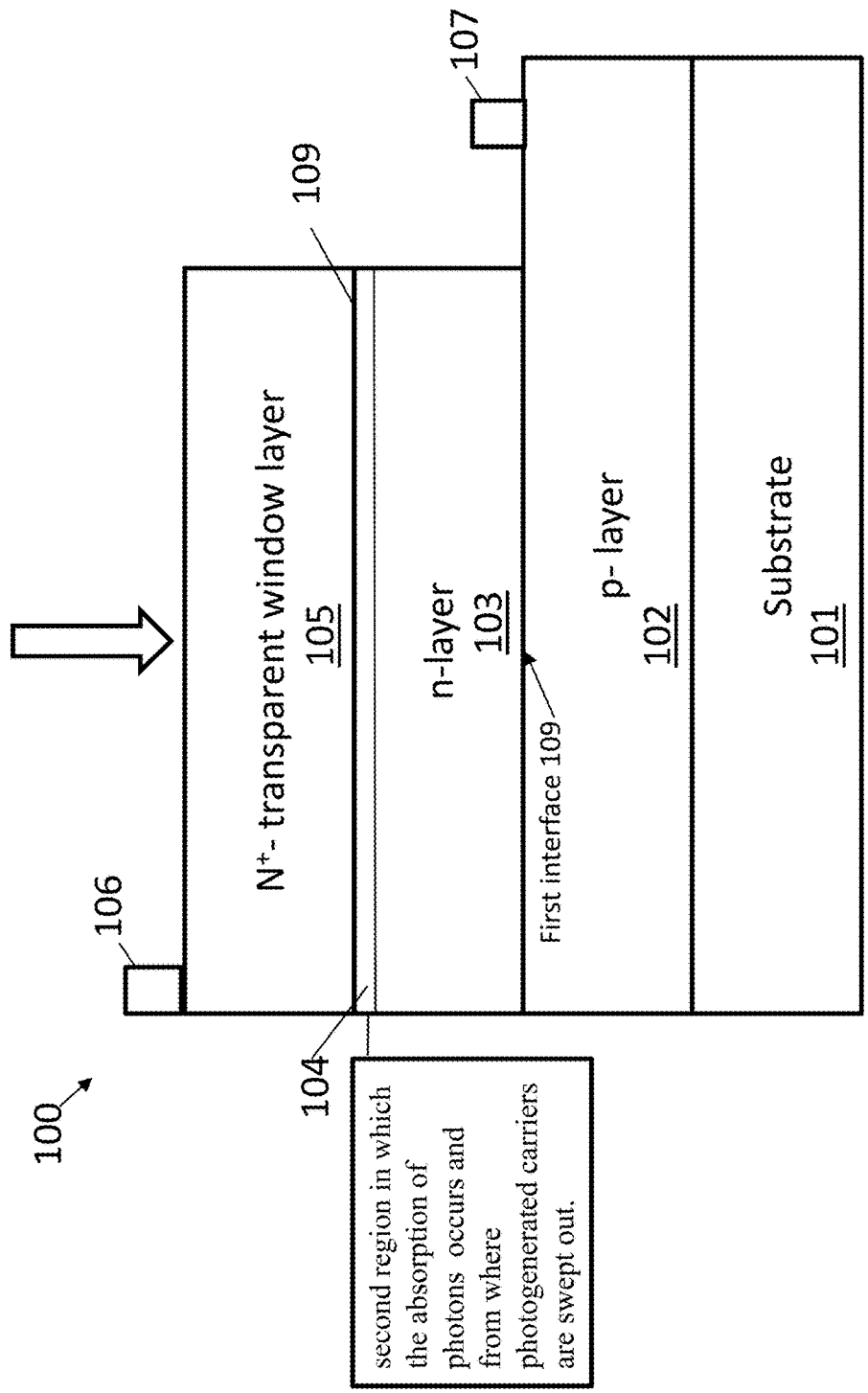
FIG. 12 is an illustration of an alternate preferred embodiment comprising a p-n$^-$-N$^+$ photodiode illuminated through the transparent N$^+$ window suitable for forming an Ohmic contact and showing the absorption region for the photons of the predetermined energy range.

Referring now to FIG. 12, shown is preferred embodiment 100 comprising a substrate 101, p-layer 102, n layer 103 and transparent window layer 105, which is formed predominately of a N+ material, i.e., an n-type material with excess doping and transparent at the detection wavelength of interest potentially utilizing a wider band gap material than layer 103. Layer 105 is transparent at the predetermined photon energy range and is also suitable for making an operative connection to a contact 106. The preferred embodiment photodiode 100 eliminates or minimizes surface recombination of photogenerated carriers generated by photons having a predetermined energy range. The region 104 has a short absorption depth within an effective diffusion length of the surface or interface of the n-layer 103 for the photons having a predetermined energy range. The n layer or second region 103 is formed of a semiconductor having a high surface or interface recombination velocity. The first semiconductor region 105 and the n layer 103 (second region) form a first interface 109 such that the second region is depleted at the interface between the second region and the transparent region at the reverse bias point of operation. The region 103 is depleted to include the region 104; and the depletion extends from the first interface through the absorption region 104 through the region denoted 103 at the operating bias. The depletion results in the creation of an electric field and photogenerated carriers are collected by drift and the photons at the predetermined energy are detected as current. The current will flow between the terminals 106 and 107.

Figure 13:
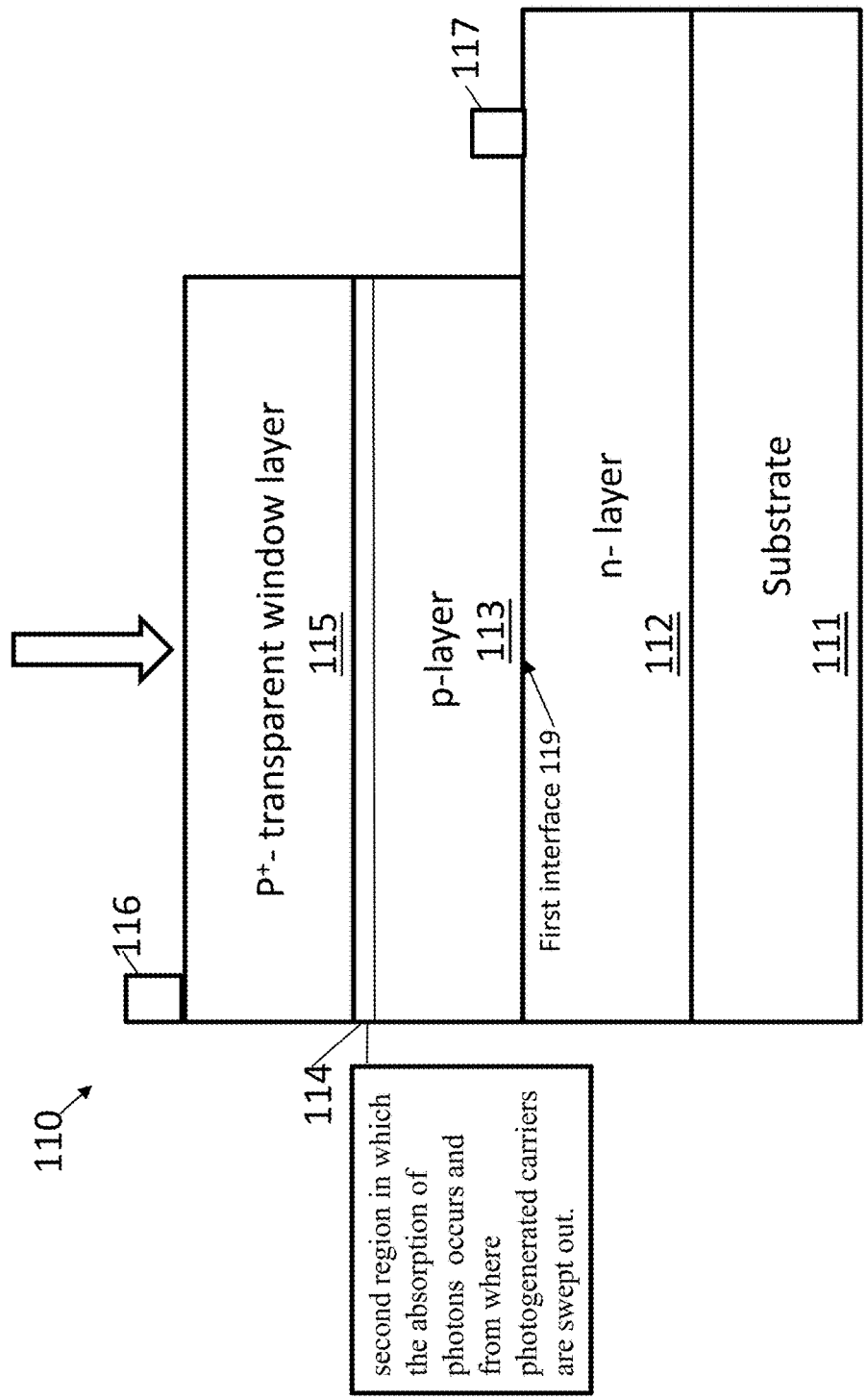
FIG. 13 is an illustration of an alternate preferred embodiment comprising a n-p$^-$-P$^+$ photodiode illuminated through the transparent P$^+$ window suitable for forming an Ohmic contact and showing the absorption region for the photons of the predetermined energy range.

Referring now to FIG. 13, shown is preferred embodiment 110 comprising a substrate 111, n-layer 112, p layer 113 and transparent window layer 115, which is formed predominately of a P+ material, i.e., an p-type material with excess doping and transparent at the detection wavelength of interest potentially utilizing a wider band gap material than layer 113. Layer 115 is transparent at the predetermined photon energy range and is also suitable for making an operative connection to a contact 116. The preferred embodiment photodiode 110 eliminates or minimizes surface recombination of photogenerated carriers generated by photons having a predetermined energy range. The absorption region 114 is within an effective diffusion length of the surface or interface for the photons having a predetermined energy range. The p layer or second region 113 is formed of a semiconductor having a high surface or interface recombination velocity. The first semiconductor region 115 and the p layer 113 (second region) form a first interface 119 such that the second region 113 is depleted at the interface between the second region 113 and the transparent region 115 at the reverse bias point of operation. The region 113 is depleted to include the region 114; and the depletion extends from the first interface 119 through the absorption region 114 at the operating bias. The depletion results in the creation of an electric field and photogenerated carriers within the absorption region 114 are collected by drift and the photons at the predetermined energy are detected as current. The current will flow between the terminals 116 and 117.

It can thus be seen that the present invention provides an approach for realizing a highly efficient SPAD in DUV spectrum at wavelengths shorter than 280 nm, as the key transducing element within a SPAD module is the avalanche photodiode. Currently system designers requiring high sensitivity and low noise UV detectors for spectroscopy and single photon counting have the option of employing PMTs or UV enhanced Si avalanche photodetectors. PMTs have significant shortcomings, including high cost (—$2000 with power supply and cooling), bulky packaging, susceptibility to magnetic fields, requiring high voltage for operation (>1000 V) and cooling for high sensitivity. UV enhanced Si avalanche photodetectors can provide high gain, but can have high dark current and significant long wavelength response that can make them suboptimal for applications such as biological agent detection. Commercially available Si based single photon counting detectors (SPADs) have not been specified for operation below 300 nm. The present invention provides an approach for developing a semiconductor based SPAD with efficient detection in DUV spectral range between 200-280 nm. The preferred embodiments are advantageous for system designers because:

The preferred embodiments of the present invention can be operated at room temperature, while PMTs often require thermoelectric cooling depending upon the sensitivity required.

PMTs require the cathode detection material and dynode gain medium to be encased within a vacuum sealed tube. This packaging is inherently more fragile than that employed for semiconductor based detectors.

The present invention provides a novel approach for increasing the deep ultraviolet response in a SiC based avalanche photodiode in a more robust fashion. This is accomplished by extending the depletion region of the illuminated n-type doped layer under high reverse bias where the device exhibits substantial gain. It also leverages the inhomogeneous gain associated with strong absorption of these DUV photon at the illuminated semiconductor surface and higher ionization rate of holes over electrons within SiC. This design also takes advantage of these phenomena to realize low excess noise in the spectral range of interest via single carrier multiplication within the developed structure without the use of a charge layer. This can lead to further improvements in detection efficiency over a conventional separate-absorption-charge-multiplication structure.

As used herein (in the drawings, specification. abstract and claims), the term "light" means electromagnetic radiation, unless specifically noted to the contrary. In the drawings, the symbol λ means electromagnetic radiation. Within the light spectrum, the solar blind region refers to the region of the light spectrum wherein, due to absorption of sunlight by the atmosphere, the potential interfering effect of sunlight does not occur; i.e., normally considered to be less than 280 nm at low elevations.

As used herein, the terminology "layer" includes "region" and is not limited to a single thickness of a material covering or overlying another part or layer, but encompasses a region having a variety of configurations and/or thicknesses.

As used herein, the terminology "multiplication layer" or "multiplication region" means a layer or layers or region in which the carriers predominantly multiply. The carriers may be either holes and/or electrons.

As used herein, the terminology "absorption layer", "absorption region", "absorber", "absorber region" means a layer or layers or region in which photons are predominantly absorbed and photogenerated carriers created. Absorption and multiplication may occur in the same layers (or regions).

As used herein, the terminology "spectrally inhomogeneous gain" in a representative structure is shown in FIG. 5. FIG. 5 shows that photons of different wavelengths generate carriers that have different gain associated with them. For an n-i-p structure, the gain at 200 nm is ~310 while at 360 nm it is ~75. In contrast for a p-i-n structure the opposite is the case, gain at 360 nm is ~6× greater than gain at 200 nm. This phenomena is related to 1) the ionization rate of the principal carrier that is being multiplied in the gain region and 2) where the photons are absorbed within the structure that effects the distance photogenerated carriers travel inside the gain region. As holes have a higher ionization rate that electrons in 4H-SiC and deep ultraviolet photons are absorbed very close to the surface, an n-i-p device operating at these wavelengths has higher gain. This phenomenon is partially responsible for the emerging 212 nm peak observed in FIG. 3 at biases above 130V where one starts seeing effects of gain.

As used herein (in the drawings, specification. abstract and claims), the term "light" means electromagnetic radiation, unless specifically noted to the contrary. In the drawings, the symbol means electromagnetic radiation. Within the light spectrum, the solar blind region refers to the region of the light spectrum wherein, due to absorption of sunlight by the atmosphere, the potential interfering effect of sunlight does not occur; i.e., normally considered to be less than 280 nm at low elevations.

As used herein, the terminology "layer" includes "region" and is not limited to a single thickness of a material covering or overlying another part or layer, but encompasses a region having a variety of configurations and/or thicknesses.

As used herein, the terminology "multiplication layer" or "multiplication region" means a layer or layers or region in which the carriers predominantly multiply. The carriers may be either holes and/or electrons.

As used herein, the terminology "absorption layer", "absorption region", "absorber", "absorber region" means a layer or layers or region in which photons are predominantly absorbed and photogenerated carriers created. Absorption and multiplication may occur in the same layers (or regions).

As used herein, the terminology "potential" with respect to "electrostatic potential" refers to voltage potential.

As used herein, the terminology InGaN, (In)GaN or InxGa1-xN refers to the binary compound GaN or a ternary compound of InGaN having arbitrary mole fraction of InN.

As used herein, the terminology AlGaN, (Al)GaN or AlxGa1-xN refers to the binary compound GaN (when x=0) or a ternary compound of AlGaN having arbitrary mole fraction of AlN.

As used herein, the terminology (Al)(In)GaN or (In)(Al)GaN refers to the binary compound GaN or ternary or quaternary III-Nitride semiconductor compound having arbitrary mole fractions of InN and/or AlN.

As used herein, the terminology "approximately" means something is almost, but not completely, accurate or exact; roughly.

As used herein, the terminology (In)AlN refers to the binary compound AlN or ternary compound having arbitrary mole fractions of InN.

As used herein the terminology "p-metal contact" means a metal contact to a p-type layer.

As used herein the terminology "n-metal contact" means a metal contact to an n-type layer.

As used herein, the terminology p layer means p-type doped semiconductor layer.

As used herein, the terminology $n^+$ layer means an n-type doped semiconductor layer with increased doping concentration.

As used herein, the terminology $p^+$ layer means a p-type doped semiconductor layer with increased doping concentration.

As used herein, the terminology $n^-$ layer means a n-type semiconductor that has sufficiently low doping so that it is mostly depleted at zero bias As used herein, the terminology $p^-$-layer layer means a p-type semiconductor that has sufficiently low doping so that it is mostly depleted at zero bias As used herein, the terminology N-layer refers to a semiconductor layer having n-type doping and is transparent at the wavelength of interest for detection As used herein, the terminology P-layer refers to a semiconductor layer having p-type doping and is transparent at the wavelength of interest for detection As used herein, the absorption depth refers to a thickness within a layer wherein 1−1/e (e=natural logarithm=0.368); i.e., approximately 63% of the photons at the detection wavelength of interest are absorbed according to Beer's Law.

As used herein the effective diffusion length is the distance from the depth from the absorption depth at which the carriers are created to the distance such that a majority of carriers reach the depletion region prior to recombining. Diffusion is the net movement of carriers from a region of high concentration to a region of low concentration of carriers.

It is understood that an absorption depth and the effective diffusion length (see FIG. 26) are parameters that describe a distribution of carriers and that the initial distribution is defined by the photon absorption probability according to, for example, Beer's Law, as appreciated by persons of ordinary skill in the art.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the claims.

The invention claimed is:

1. A photodiode for detecting photons in deep ultraviolet energy range comprising:
a substrate;
a first semiconducting region operatively associated with the substrate suitable for forming a contact thereon;
a first contact operatively associated with the first semiconducting region that collects first carriers;
a second semiconducting region comprising an absorption region for the photons in the deep ultraviolet energy range impinging upon an absorption interface of the absorption region; the second semiconducting region being formed of a semiconductor having one or more of a high surface recombination or a high interface recombination for carriers generated by deep ultraviolet photons and being suitable for forming a contact thereon;
a second contact that collects second carriers operatively associated with the second semiconducting region;
an intermediate semiconducting region between the first semiconducting region and the second semiconducting region wherein carrier multiplication occurs by impact ionization;
a first interface between the first semiconducting region and the intermediate semiconducting region;
a second interface between the second semiconducting region and the intermediate semiconducting region;
doping of the second semiconducting region being less than doping of the first semiconducting region such that depletion occurs to a greater extent towards the absorption interface upon which the photons impinge in the second semiconducting region than in the first semiconducting region upon increasing reverse bias; the second semiconducting region having a doping concentration such that reverse biasing the photodiode between the first and second contacts produces an undepleted portion adjacent to the absorption interface having a thickness less than an absorption depth from the absorption interface so that recombination of carriers is mitigated, and a depleted portion; the undepleted portion being located adjacent to the depleted portion such that a majority of the photons impinging upon the second semiconducting region are absorbed in the depleted portion and converted to carriers and such that with the increasing reverse bias, the depleted portion increases in thickness towards the absorption interface such that the undepleted portion becomes smaller than the absorption depth and therefore deep ultraviolet photo-generated carriers are collected more efficiently instead of being lost to recombination at the absorption interface;

the second semiconducting region having the doping concentration that varies with thickness such that the doping concentration increases from the second interface to the absorption interface resulting in a diminishing electric field from the second interface to the absorption interface; the undepleted portion being sufficiently doped to create an N or P type material and remain undepleted during reverse biasing;

whereby the second carriers generated will have a short path to the absorption interface and the first carriers will have a long path to the first semiconducting region which enables a gain to be greater for the deep ultraviolet photons than for photons not in the deep ultraviolet energy range.

2. The photodiode of claim 1 wherein the second semiconducting region is formed of SiC and wherein the first carriers are holes and the second carriers are electrons, and wherein the second semiconducting region has the doping concentration of n-type dopant impurities that increases from the second interface to the absorption interface upon which the photons impinge by a gradual increase or a variable rate increase wherein in the second semiconducting region only photon absorption and carrier generation occurs and not multiplication of carriers.

3. The photodiode of claim 1 further comprising one of a semi-transparent metal conductor region or a transparent semiconducting region at the deep ultraviolet energy range adjacent to the second semiconducting region suitable for forming an n-metal contact that uniformly spreads an electric field laterally within the photodiode; and wherein the second semiconducting region is formed of SiC and has the doping concentration of n-type dopant impurities that varies with thickness.

4. The photodiode of claim 1 wherein the first semiconducting region comprises p-type silicon carbide with an aluminum doping in a range from $1\times10^{18}$ cm$^{-3}$-$1\times10^{19}$ cm$^{-3}$ and wherein the intermediate region comprises n-type silicon carbide with a nitrogen atom doping in a range from $1\times10^{15}$ cm$^{-3}$ to $1\times10^{16}$ cm$^{-3}$ and a thickness in a range from 250-1000 nm and wherein the second semiconducting region comprises a first portion comprising n-type silicon carbide with a nitrogen doping increasing from $1\times10^{16}$ cm$^{-3}$ to $1\times10^{18}$ Cm$^{-3}$ over a thickness in a range from 50 to 100 nm and a second portion comprising n-type silicon carbide with a nitrogen doping in the range of $1$-$5\times10^{18}$ cm$^{-3}$ over a thickness in a range of 10 to 40 nm and wherein upon the reverse biasing, the undepleted portion having the thickness less than the absorption depth forms in the second portion such that the recombination of carriers at the absorption interface is mitigated.

5. The photodiode of claim 1 wherein the second semiconducting region comprises n-type silicon carbide having a first portion having a thickness in a range from 50 to 100 nm and a second portion adjacent to the absorption interface having a thickness in a range of 10 to 40 nm; and wherein upon the reverse biasing, the undepleted portion having the thickness less than the absorption depth forms in the second portion such that the recombination of carriers at the absorption interface is mitigated.

6. The photodiode of claim 1 further comprising a transparent semiconducting region that is transparent at the deep ultraviolet energy range adjacent to the absorption interface of the second semiconducting region and suitable for mounting the second contact and wherein the transparent semiconducting region comprises AlGaN having a ratio of aluminum to gallium of greater than 80%, and having a free electron concentration from $1\times10^{17}$ cm$^{-3}$ to $1\times10^{19}$ cm$^{-3}$ and having a thickness in a range of 50-470 nm.

7. The photodiode of claim 1 wherein the thickness of the second semiconducting region is between 20-120 nm and preferred n-type doping concentration range is $9\times10^{17}$ to $5\times10^{18}$ cm$^{-3}$.

8. The photodiode of claim 1 wherein the first semiconducting region comprises p-type silicon carbide with an aluminum doping in a range from $1\times10^{18}$ cm$^{-3}$-$1\times10^{19}$ cm$^{-3}$ and wherein the intermediate region comprises n-type silicon carbide with a nitrogen atom doping in a range from $1\times10^{15}$ cm$^{-3}$ to $1\times10^{16}$ cm$^{-3}$ and a thickness in a range from 250-1000 nm and wherein the second semiconducting region comprises a first portion comprising n-type silicon carbide with a nitrogen doping increasing from $1\times10^{16}$ cm$^{-3}$ to $1\times10^{18}$ cm$^{-3}$ over a thickness in a range from 50 to 100 nm and a second portion comprising n-type silicon carbide with a nitrogen doping up to $5\times10^{18}$ cm$^{-3}$ over a thickness in a range from 10 to 40 nm and wherein upon the reverse biasing the undepleted portion having the thickness less than the absorption depth forms in the second portion that enhances the gain for the deep ultraviolet photons relative to that for the photons not in the deep ultraviolet energy range.

9. The photodiode of claim 1 wherein the first semiconducting region comprises p-type silicon carbide with an aluminum doping in a range from $1\times10^{18}$ cm$^{-3}$-$1\times10^{19}$ cm$^{-3}$ and wherein the second semiconducting region comprises a first portion comprising n-type silicon carbide with a nitrogen doping increasing from $1\times10^{16}$ cm$^{-3}$ to $1\times10^{18}$ cm$^{-3}$ over a thickness in a range from 50 to 100 nm and a second portion comprising n-type silicon carbide with a nitrogen doping concentration in a range of $1$-$5\times10^{18}$ cm$^{-3}$ over a thickness in a range of 10 to 40 nm and wherein upon the reverse biasing, the undepleted portion having the thickness less than the absorption depth forms in the second portion that enhances the gain for the deep ultraviolet photons relative to that for the photons not in the deep ultraviolet energy range such that recombination of carriers at the absorption interface is mitigated.

10. The photodiode of claim 1 wherein the first semiconducting region comprises p-type silicon carbide with an aluminum doping in a range from $1\times10^{18}$ cm$^{-3}$-$1\times10^{19}$ cm$^{-3}$ and wherein the second semiconducting region comprises n-type silicon carbide with a nitrogen atom doping in a range from $1\times10^{15}$ cm$^{-3}$ to $1\times10^{16}$ cm$^{-3}$ and a thickness in a range from 250-1000 nm and further comprising a transparent semiconductor conducting region comprising AlGaN having a ratio of aluminum to gallium of greater than 80%, and having a free electron concentration from $1\times10^{17}$ cm$^{-3}$ to $1\times10^{19}$ cm$^{-3}$ and having a thickness between 50-470 nm.

11. A photodiode for improved collection of carriers generated by photons in deep ultraviolet energy range comprising:
a substrate;
a first semiconducting region operatively associated with the substrate suitable for forming a contact thereon;
a first contact operatively associated with the first semiconducting region that collects first carriers;
a second semiconducting region comprising a boundary upon which the photons impinge and an absorption region for the photons having the deep ultraviolet energy range; the second semiconducting region being formed of a semiconductor having a high surface or interface recombination at an absorption boundary for carriers generated by deep ultraviolet photons and suitable for forming a contact thereon;

a second contact that collects second carriers operatively associated with the second semiconducting region;

the first semiconducting region and the-second semiconducting region forming a first interface; doping of the second semiconducting region being less than doping of the first semiconducting region such that depletion occurs to a greater extent towards the boundary upon which the photons impinge in the second semiconducting region than in the first semiconducting region upon increasing reverse bias; the second semiconducting region having a doping concentration such that reverse biasing the photodiode between the first and second contacts-produces an undepleted portion adjacent to the absorption boundary having a thickness less than an absorption depth from the absorption boundary so that recombination of carriers is mitigated, and a depleted portion; the undepleted portion being located adjacent to the depleted portion such that a majority of the photons impinging upon the second semiconducting region are absorbed in the depleted portion and converted to carriers and such that with increasing reverse bias, the depleted portion increases in thickness towards the absorption boundary such that the undepleted portion becomes smaller than the absorption depth and therefore deep ultraviolet photo-generated carriers are collected more efficiently instead of being lost to recombination at the absorption interface.

12. The photodiode of claim 11 wherein the second semiconducting region formed of SiC and wherein the first carriers are holes and the second carriers are electrons and wherein the second semiconducting region has a doping level of impurities that increases from the first interface to an opposing boundary of the second semiconducting region by a gradual increase or a variable rate increase.

13. The photodiode of claim 11 wherein the first semiconducting region comprises p-type silicon carbide with an aluminum doping in a range from $1 \times 10^{18}$ cm$^{-3}$-$1 \times 10^{19}$ cm$^{-3}$ and wherein the second semiconducting region comprises a first portion comprising n-type silicon carbide with a nitrogen doping increasing from $1 \times 10^{16}$ cm$^{-3}$ to $1 \times 10^{18}$ cm$^{-3}$ over a thickness in a range from 50 to 100 nm and a second portion comprising n-type silicon carbide with a nitrogen doping concentration up to $5 \times 10^{18}$ cm$^{-3}$ and having a thickness in a range of 10 to 40 nm; and wherein with increasing bias, the depletion occurring in the n-type silicon carbide of the second semiconducting region and the p-type silicon carbide of the first semiconducting region increases; the increase in the depletion of the n-type silicon carbide of the second semiconducting region being larger due to lower doping in the n-type silicon carbide of the second semiconducting region; the increase in depletion of the n-type silicon carbide of the second semiconducting region extending within the absorption depth of the photons resulting in the improved collection of the carriers generated by the photons rather than lost to surface recombination; whereby increasing the depletion enhances deep ultraviolet photoresponse relative to the near ultraviolet response.

14. The photodiode of claim 11 wherein the first semiconducting region comprises p-type silicon carbide with an aluminum doping in a range from $1 \times 10^{18}$ cm$^{-3}$-$1 \times 10^{19}$ cm$^{-3}$ and wherein the second semiconducting region comprises a first portion comprising n-type silicon carbide with a nitrogen doping increasing from $1 \times 10^{16}$ cm$^{-3}$ to $1 \times 10^{18}$ cm$^{-3}$ over a thickness in a range from 50 to 100 nm and a second portion comprising an n-type silicon carbide with a nitrogen doping in a range of $1 \times 10^{18}$ cm$^{-3}$ to $5 \times 10^{18}$ cm$^{-3}$ over a thickness in a range of 10 to 40 nm; whereby with increasing bias the depletion occurring in the n-type silicon carbide of the second semiconducting region and the p-type silicon carbide of the first semiconducting region increases; the increase in the depletion of the n-type silicon carbide of the second semiconducting region being larger due to lower doping in the n-type silicon carbide of the second semiconducting region; the increase in depletion of the n-type silicon carbide of the second semiconducting region extends within the absorption depth of the photons resulting in the improved collection of the carriers generated by the photons being absorbed in the depletion rather than lost to surface recombination; whereby increasing the depletion enhances deep ultraviolet photoresponse.

15. The photodiode of claim 11 further comprising one of a semi-transparent metal conductor region or a transparent semiconducting region at the deep ultraviolet energy range adjacent to the second semiconducting region suitable for forming an n-metal contact that uniformly spreads an electric field laterally within the photodiode; and wherein the second semiconducting region is formed of SiC and has a doping concentration of n-type dopant impurities that varies with thickness.

16. The photodiode of claim 15 wherein the transparent semiconducting region-comprises AlGaN having a ratio of aluminum to gallium of greater than 80%, and having a free electron concentration from $1 \times 10^{17}$ cm$^{-3}$ to $1 \times 10^{19}$ cm$^{-3}$ and having a thickness in a range of 50-470 nm.

17. The photodiode of claim 11 wherein the thickness of the second semiconducting region is between 20-120 nm and preferred n-type doping concentration range is $9 \times 10^{17}$ to $5 \times 10^{18}$ cm$^{-3}$.

18. The photodiode of claim 11 wherein the first semiconducting region comprises p-type silicon carbide with an aluminum doping in a range from $1 \times 10^{18}$ cm$^{-3}$-$1 \times 10^{19}$ cm$^{-3}$ and wherein the second semiconducting region comprises a first portion of n-type silicon carbide with a nitrogen doping increasing from $1 \times 10^{16}$ cm$^{-3}$ to $1 \times 10^{18}$ cm$^{-3}$ over a thickness in a range of 50 to-100 nm and a second portion comprising n-type silicon carbide having a doping of $1 \times 10^{18}$ cm$^{-3}$-over a thickness in a range from 10 to 40 nm.

19. The photodiode of claim 11 wherein the second semiconducting region is doped in a range from $1 \times 10^{15}$ cm$^{-3}$ to $1 \times 10^{16}$ cm$^{-3}$ and has a thickness in a range from 250-1000 nm and further comprising a transparent semiconducting region that is transparent at a predetermined photon energy range; the transparent semiconducting region being suitable for mounting the second contact and adjacent to the second semiconducting region and wherein the transparent semiconducting region comprises AlGaN having a ratio of aluminum to gallium of greater than 80%, and having a free electron concentration from $1 \times 10^{17}$ cm$^{-3}$ to $1 \times 10^{19}$ cm$^{-3}$ and having a thickness in a range of 50-470 nm.

20. A method of making a photodiode for detecting photons in deep ultraviolet range that eliminates or minimizes surface recombination of photogenerated carriers at an absorption interface comprising the following steps, not necessarily in the following order:

providing a substrate;

providing a first semiconducting region operatively associated with the substrate suitable for forming a contact thereon;

providing a first contact operatively associated with the first semiconducting region that collects first carriers;

providing a second semiconducting region formed of a semiconductor having a high surface recombination or a high interface recombination and comprising an interface upon which photons impinge, providing a second contact that collects second carriers operatively associated with the second semiconducting region;

providing an intermediate semiconducting region between the first semiconducting region and the second semiconducting region wherein carrier multiplication occurs by impact ionization, wherein a second interface is between the second semiconducting region and the intermediate semiconducting region;

the second semiconducting region being doped less than doping of the first semiconducting region such that depletion occurs to a greater extent towards the interface upon which the photons impinge in the second semiconducting region than in the first semiconducting region upon increasing reverse bias; the second semiconducting region having a doping concentration such that reverse biasing the photodiode between the first and second contacts produces an undepleted portion adjacent to the absorption interface having a thickness less than an absorption depth from the absorption interface so that recombination of carriers is mitigated, and a depleted portion; the undepleted portion being located adjacent to the depleted portion such that a majority of the photons impinging upon the second semiconducting region are absorbed in the depleted portion and converted to carriers and such that with the increasing reverse bias, the depleted portion increases in thickness towards the absorption interface such that the undepleted portion becomes smaller than the absorption depth and therefore deep ultraviolet photo-generated carriers are collected;

the second semiconducting region having the doping concentration that varies with thickness such that the doping concentration increases from the second interface to the absorption interface resulting in a diminishing electric field from the first second interface to the absorption interface; the undepleted portion being sufficiently doped to create an N or P type material and remain undepleted during reverse biasing;

whereby the second carriers generated will have a short path to the absorption interface and the first carriers will have a long path to the first semiconducting region which enables a gain to be greater for the deep ultraviolet photons than for photons not in the deep ultraviolet energy range.

* * * * *